(12) United States Patent
Koukitu et al.

(10) Patent No.: US 11,499,247 B2
(45) Date of Patent: Nov. 15, 2022

(54) VAPOR-LIQUID REACTION DEVICE, REACTION TUBE, FILM FORMING APPARATUS

(71) Applicants: National University Corporation Tokyo University of Agriculture and Technology, Tokyo (JP); Taiyo Nippon Sanso Corporation, Tokyo (JP); Taiyo Nippon Sanso CSE Corporation, Kanagawa (JP)

(72) Inventors: Akinori Koukitu, Fuchu (JP); Hisashi Murakami, Fuchu (JP); Akira Yamaguchi, Tsukuba (JP); Kazushige Shiina, Kawasaki (JP); Hayato Shimamura, Kawasaki (JP)

(73) Assignees: National University Corporation Tokyo University of Agriculture and Technology, Tokyo (JP); Taiyo Nippon Sanso Corporation, Tokyo (JP); Taiyo Nippon Sanso CSE Corporation, Kanagawa (JP)

( * ) Notice: Subject to any disclaimer, the term of this patent is extended or adjusted under 35 U.S.C. 154(b) by 187 days.

(21) Appl. No.: 16/614,577

(22) PCT Filed: May 17, 2018

(86) PCT No.: PCT/JP2018/019191
§ 371 (c)(1),
(2) Date: Nov. 18, 2019

(87) PCT Pub. No.: WO2018/212303
PCT Pub. Date: Nov. 22, 2018

(65) Prior Publication Data
US 2020/0071848 A1    Mar. 5, 2020

(30) Foreign Application Priority Data

May 18, 2017 (JP) .............................. JP2017-098870

(51) Int. Cl.
*C30B 25/08* (2006.01)
*C30B 25/14* (2006.01)
(Continued)

(52) U.S. Cl.
CPC .......... *C30B 25/08* (2013.01); *C01B 21/0632* (2013.01); *C23C 16/34* (2013.01);
(Continued)

(58) Field of Classification Search
CPC ....... C30B 25/14; C30B 25/08; C30B 29/406; C30B 25/02; C23C 14/243;
(Continued)

(56) References Cited

U.S. PATENT DOCUMENTS

2005/0008799 A1* 1/2005 Tomiyasu ........... C23C 16/4481
428/34.1
2009/0087545 A1* 4/2009 Ohmi .................... C23C 14/246
118/724

(Continued)

FOREIGN PATENT DOCUMENTS

JP    2012-248803 A    12/2012
JP    2016-044341 A    4/2016
(Continued)

OTHER PUBLICATIONS

International Search Report issued in corresponding International Patent Application No. PCT/JP2018/019191 dated Jul. 24, 2018.

*Primary Examiner* — Aiden Lee
(74) *Attorney, Agent, or Firm* — Morgan, Lewis & Bockius LLP

(57) ABSTRACT

This disclosure provides a vapor-liquid reaction device including a vapor-liquid reaction chamber and a projecting member. The vapor-liquid reaction chamber holds a molten metal in a lower portion of an internal space of the vapor-liquid reaction chamber.

20 Claims, 8 Drawing Sheets

(51) Int. Cl.
*C23C 16/448* (2006.01)
*C01B 21/06* (2006.01)
*C23C 16/34* (2006.01)
*C30B 29/40* (2006.01)
*H01L 21/02* (2006.01)

(52) U.S. Cl.
CPC .......... *C23C 16/4488* (2013.01); *C30B 25/14* (2013.01); *C30B 29/406* (2013.01); *H01L 21/0254* (2013.01); *H01L 21/0262* (2013.01)

(58) Field of Classification Search
CPC ... C23C 16/4488; C23C 16/34; C23C 16/303; C23C 16/448; C01B 21/0632; C01B 21/06; H01L 21/0254; H01L 21/0262; H01L 21/205; C01G 15/00
See application file for complete search history.

(56) References Cited

U.S. PATENT DOCUMENTS

2012/0305935 A1* 12/2012 Fujikura ............... C23C 16/303
257/76
2013/0130477 A1 5/2013 Koukuti et al.

FOREIGN PATENT DOCUMENTS

JP 2016-044342 A 4/2016
WO 2011/142402 A1 11/2011

* cited by examiner

VAPOR-LIQUID REACTION DEVICE, REACTION TUBE, FILM FORMING APPARATUS

TECHNICAL FIELD

The present disclosure relates to a vapor-liquid reaction device, a reaction tube, and a film forming apparatus.

BACKGROUND ART

Vapor-liquid reaction devices that perform vapor-liquid reactions between liquids and gases are already known.

A vapor-liquid reaction device is employed, for example, as a configuration element of a film forming apparatus using hydride vapor phase epitaxy (HYPE).

For example, Patent Document 1 discloses a substrate treatment device to treat a substrate using a processing gas generated by reacting a liquid raw material with a reaction gas, and the substrate treatment device is employed as a device capable of raising the generation efficiency of the process gas generated by reacting the liquid raw material with the reaction gas. The substrate treatment device includes a vessel that holds the liquid raw material generated by melting a metal raw material, and receives supply of the reaction gas from upstream and discharges the process gas downstream. The substrate treatment device also includes at least one partition member installed in the vessel to partition a space in the vessel above the liquid surface of the liquid raw material in the vessel into plural generation spaces arrayed sequentially from upstream to downstream. A through hole is formed in each partition member to place two adjacent generation spaces in communication with each other and allow gas to pass. When the gas in an upstream side generation space passes through the through hole and flows into a downstream side generation space, the speed at which the gas passes through the through hole is increased so as to generate a jet flow, and such that a convection flow of the gas is induced by the jet flow in the downstream side generation space.

Patent Document 2 also discloses a substrate treatment device to treat a substrate using a processing gas produced by reacting a liquid raw material with a reaction gas, and is employed as a device capable of raising the production efficiency of the process gas produced by reacting the liquid raw material with the reaction gas. The substrate treatment device includes a vessel that holds the liquid raw material generated by melting a metal raw material, and receives supply of the reaction gas from upstream and discharges the process gas downstream. The substrate treatment device also includes at least one partition member installed in the vessel to partition a space in the vessel above the liquid surface of the liquid raw material in the vessel into plural generation spaces arrayed sequentially from upstream to downstream. A rectification mechanism (such as a rectification plate) is provided inside each of the generation spaces to cause gas to flow toward the liquid surface of the liquid raw material.

Patent Document 3 discloses a metal chloride gas generator capable of improving the stability of metal chloride gas concentration and improving responsivity to fluctuations in concentration of the metal chloride gas. The metal chloride gas generator includes a raw material vessel for holding a metal raw material, includes a gas supply port provided in the raw material vessel for supplying a chlorine-containing gas containing a chlorine-based gas into the raw material vessel, includes a gas discharge port provided in the raw material vessel to discharge a metal chloride-containing gas, which contains a metal chloride gas produced by a reaction between the chlorine-based gas contained in the chlorine-containing gas and the metal raw material, to outside the raw material vessel, and includes partition plates for partitioning a space above the metal raw material in the raw material vessel to form a gas flow path extending from the gas supply port to the gas discharge port. The gas flow path is formed so as to be a continuous path from the gas supply port to the gas discharge port, with a flow path width of the gas flow path in a horizontal direction not exceeding 5 cm, and the gas flow path including a bent portion.

In HVPE a film of gallium nitride (GaN) is formed by reacting gallium (I) chloride gas (GaCl) with ammonia gas ($NH_3$).

Patent Document 4 discloses a method capable of forming a film of gallium nitride (GaN) at a faster growth rate compared to HVPE by using a method to form a film of gallium nitride by reacting gallium (III) chloride gas ($GaCl_3$) with ammonia gas ($NH_3$). Patent Document 3 discloses a method of reacting gallium (I) chloride gas with chlorine gas ($Cl_2$) as the a method to produce the gallium (III) chloride gas mentioned above.

Patent Document 1: Japanese Patent Application Laid-Open (JP-A) No. 2016-44342
Patent Document 2: JP-A No. 2016-44341
Patent Document 3: JP-A No. 2012-248803
Patent Document 4: International Publication (WO) No. 2011/142402

SUMMARY OF INVENTION

Technical Problem

A method called tri-halide vapor phase epitaxy (THVPE) is described in Patent Document 4. In this method a gallium nitride film is formed by a reaction between gallium (III) chloride gas ($GaCl_3$) and ammonia gas ($NH_3$).

In both HVPE and THVPE, gallium (I) chloride gas (GaCl) is generated by a vapor phase reaction between molten Ga (namely, Ga (l), described later) and a source gas by causing a mixed gas of a carrier gas and the source gas to flow in one direction over molten Ga.

To produce GaCl in HVPE, either hydrogen gas ($H_2$) or a mixed gas of hydrogen gas and nitrogen gas ($N_2$) is employed as the carrier gas, and hydrogen chloride gas (HCl) is employed as the source gas.

GaCl is produced in HVPE according to Reaction Equation (1) below.

In the following (l) and (g) respectively indicate a liquid or a gas.

$$Ga(l)+HCl(g)GaCl(g)+½H_2(g) \qquad \text{Reaction Equation(1).}$$

In contrast thereto, to produce GaCl in THVPE (more specifically, the GaCl that serves as the raw material for $GaCl_3$), at least one out of nitrogen gas ($N_2$) or argon gas (Ar) is employed as the carrier gas, and chlorine gas is employed as the source gas.

GaCl gas is produced in THVPE according to Reaction Equation (2) below.

$$Ga(l)+½Cl_2(g)GaCl(g) \qquad \text{Reaction Equation (2).}$$

In the reaction between molten Ga and chlorine gas in THVPE, theoretically (thermodynamically) a 100% reaction would be expected, as is apparent from Reaction Equation (2).

However, it has been established that in reality the reaction between molten Ga and chlorine gas is insufficient when the molten Ga and the chlorine gas are reacted, with cases arising in which unreacted chlorine gas is carried over together with the produced gas (GaCl) to the downstream side in the direction of gas flow. There is accordingly a concern that when $Cl_2$ is mixed in with the source gas ($GaCl_3$ and $NH_3$) for the gallium nitride (GaN) film, then this will lead to a drop in the growth rate of the gallium nitride film due to the mixed-in $Cl_2$ etching the gallium nitride film.

The reason for the insufficient reaction between the molten Ga and chlorine gas is thought to be insufficient gas mixing in the vertical direction (namely, in the direction of gravity; similar applies below) at the reaction zone between molten Ga and chlorine gas due to employing at least one gas out of nitrogen gas or argon gas as the carrier gas, resulting in a layered flow developing in the flow of gas above the molten Ga, in which there is a flow of GaCl gas in the vicinity of the liquid surface of the molten Ga, and a flow of chlorine gas above the GaCl gas flow. When the flow of gas above the molten Ga has developed into the layered flow described above, there are fewer opportunities for contact between the molten Ga and the chlorine gas, and this results in insufficient reaction between the molten Ga and the chlorine gas.

The reason why employing at least one gas out of nitrogen gas or argon gas as the carrier gas readily results in insufficient gas mixing in the vertical direction is thought to be a slow rate of diffusion of the source gas and the produced gas in the carrier gas (for example, the rate of diffusion of chlorine gas and GaCl in nitrogen gas).

Note that in HVPE, the rate of diffusion of the source gas and the produced gas in the carrier gas (for example, the rate of diffusion of HCl and GaCl in hydrogen gas) is faster than that in THVPE, and so the issue of insufficient gas mixing in the vertical direction is not liable to occur in HVPE.

It has been established that when at least one gas out of nitrogen gas or argon gas is employed as the carrier gas as in the example of THVPE described above, there is a need to promote gas mixing in the vertical direction.

In relation to gas mixing in the vertical direction, in the device described in Patent Document 1 the through hole is formed in the partition member, and a jet of gas is generated by the through hole to induce convection flow of gas at the downstream side of the partition member.

However, in the device described in Patent Document 1, sometimes source gas lingers in an upper portion at the upstream side of the partition member (in the vicinity of a ceiling face), resulting in insufficient reaction between the source gas and the molten Ga.

Moreover, the technology described in Patent Document 1 relies on a jet flow of gas alone, and this necessarily causes the pressure at the upstream side of the partition member to rise. This gives rise to a concern regarding leakages of source gas to outside the device. In the method of Patent Document 1, when chlorine gas is employed as the source gas then this gives rise to concerns that the chlorine gas (source gas) might leak outside the device, and that $Cl_2$ might mix into the source gas ($GaCl_3$ and $NH_3$) for the gallium nitride (GaN) film, with the mixed-in $Cl_2$ etching the gallium nitride film and causing a drop in the growth rate of the gallium nitride film.

It is accordingly thought that a method other than a method relying on a jet flow of gas alone would be preferable as a method to promote gas mixing in the vertical direction.

In relation to gas mixing in the vertical direction, the device described in Patent Document 2 is provided with the partition member to partition the space inside the vessel, and is also separately provided with the rectification mechanism (a rectification plate, for example) to cause gas to flow toward the liquid surface of the liquid raw material. Thus in the device described in Patent Document 2, sometimes gas lingers inside the device (and particularly upstream of the partition member (for example, between the rectification plate and the partition member)).

As a method of promoting gas mixing in the vertical direction, a method is accordingly desired that is capable of promoting gas mixing in the vertical direction while suppressing gas from lingering inside the device.

In the technology described in Patent Document 3, a reaction between molten Ga and a gas is promoted by prolonging the dwell time of gas flowing over the molten Ga by causing a flow of gas to meander in a horizontal direction using the gas flow path with the bent portion.

However, the technology described in Patent Document 3 is not able to promote gas mixing in the vertical direction, and so this is not thought to be able to solve the issue described above in which the flow of gas over the molten Ga develops into a layered flow (and the resultant cases of insufficient reaction between the source gas and the molten Ga).

The present disclosure has considered the above circumstances.

Namely, an object of the present disclosure is to provide a vapor-liquid reaction device capable of promoting a reaction between a molten metal and a source gas even when at least one gas out of nitrogen gas or argon gas is employed as a carrier gas, and is also capable of suppressing gas from lingering inside the device. An object of the present disclosure is also to provide a reaction tube and a film forming apparatus including such a vapor-liquid reaction device.

Solution to Problem

Specific means that address the above issues include the following aspects.

<1> A vapor-liquid reaction device accommodating (i) a vapor-liquid reaction chamber holding a molten metal in a lower portion of an internal space of the vapor-liquid reaction chamber, with a produced gas being produced in the vapor-liquid reaction chamber by a vapor-liquid reaction between a source gas and the molten metal while a mixed gas A, supplied to an upper portion at one end side in a length direction of the internal space and containing the source gas and a carrier gas that is at least one of nitrogen gas or argon gas, is flowing along the length direction, and a mixed gas B containing the produced gas and the carrier gas being discharged from an upper portion at another end side in the length direction of the internal space, and (ii) a projecting member projecting into the internal space from a ceiling face adjoining the internal space of the vapor-liquid reaction chamber at a projection angle that is an obtuse angle at one end side in the length direction of the projecting member, and including a slit allowing passage of gas along the length direction.

<2> The vapor-liquid reaction device of <1>, wherein the projection angle is from 110° to 160°.

<3> The vapor-liquid reaction device of <1> or <2>, wherein the projecting member includes a plate-shaped member projecting from the ceiling face into the internal space.

<4> The vapor-liquid reaction device of <3>, wherein the plate-shaped member includes a bent portion bent toward the length direction one end side with respect to a projection direction of the plate-shaped member from the ceiling face into the internal space.

<5> The vapor-liquid reaction device of <4>, wherein the plate-shaped member includes a projecting portion that projects from the ceiling face into the internal space, and includes the bent portion, and an angle formed between a region of the ceiling face on the length direction one end side as viewed from the plate-shaped member and a face on the length direction one end side of the bent portion, or between a virtual plane extending the ceiling face toward the length direction one end side and the face on the length direction one end side of the bent portion, is from 70° to 110°.

<6> The vapor-liquid reaction device of any one of <1> to <5>, wherein a length of the slit in a width direction of the internal space is from 2% to 50% of a width direction length of the internal space.

<7> The vapor-liquid reaction device of any one of <1> to <6>, wherein the slit is a notch formed by notching from a leading end side of the projecting member toward a base side of the projecting member.

<8> The vapor-liquid reaction device of <7>, wherein a length direction of the slit is a direction from the leading end side of the projecting member toward the base side of the projecting member.

<9> The vapor-liquid reaction device of any one of <1> to <8>, wherein plural projecting members are provided, with the plural projecting members arrayed along the length direction of the internal space, and the slits in an adjacent pair of projecting members among the plural projecting members are arranged at positions that do not overlap with each other as viewed from the length direction one end side of the internal space.

<10> The vapor-liquid reaction device of any one of <1> to <9>, wherein the molten metal is gallium, the source gas is at least one out of chlorine gas or hydrogen chloride gas, and the produced gas is gallium (I) chloride gas.

<11> A reaction tube including the vapor-liquid reaction device of any one of <1> to <10> provided inside the reaction tube.

<12> The reaction tube of <11>, wherein the molten metal is gallium, the source gas is a first chlorine gas feed, the produced gas is gallium (I) chloride gas, and gallium (III) chloride gas is produced by a reaction between the gallium (I) chloride gas and a second chlorine gas feed.

<13> A film forming apparatus including the reaction tube of <11> or <12>.

<14> A film forming apparatus including the reaction tube of <12>, the film forming apparatus being configured to form a gallium nitride film by a reaction between gallium (III) chloride gas produced in the reaction tube and ammonia gas.

Advantageous Effects of Invention

The present disclosure provides a vapor-liquid reaction device and a reaction tube and film forming apparatus respectively provided with the vapor-liquid reaction device that are capable of promoting a reaction between a molten metal and a source gas even when at least one gas out of nitrogen gas or argon gas is employed as a carrier gas, and are also capable of suppressing gas from lingering inside the device.

DESCRIPTION OF EMBODIMENTS

Figure 1:
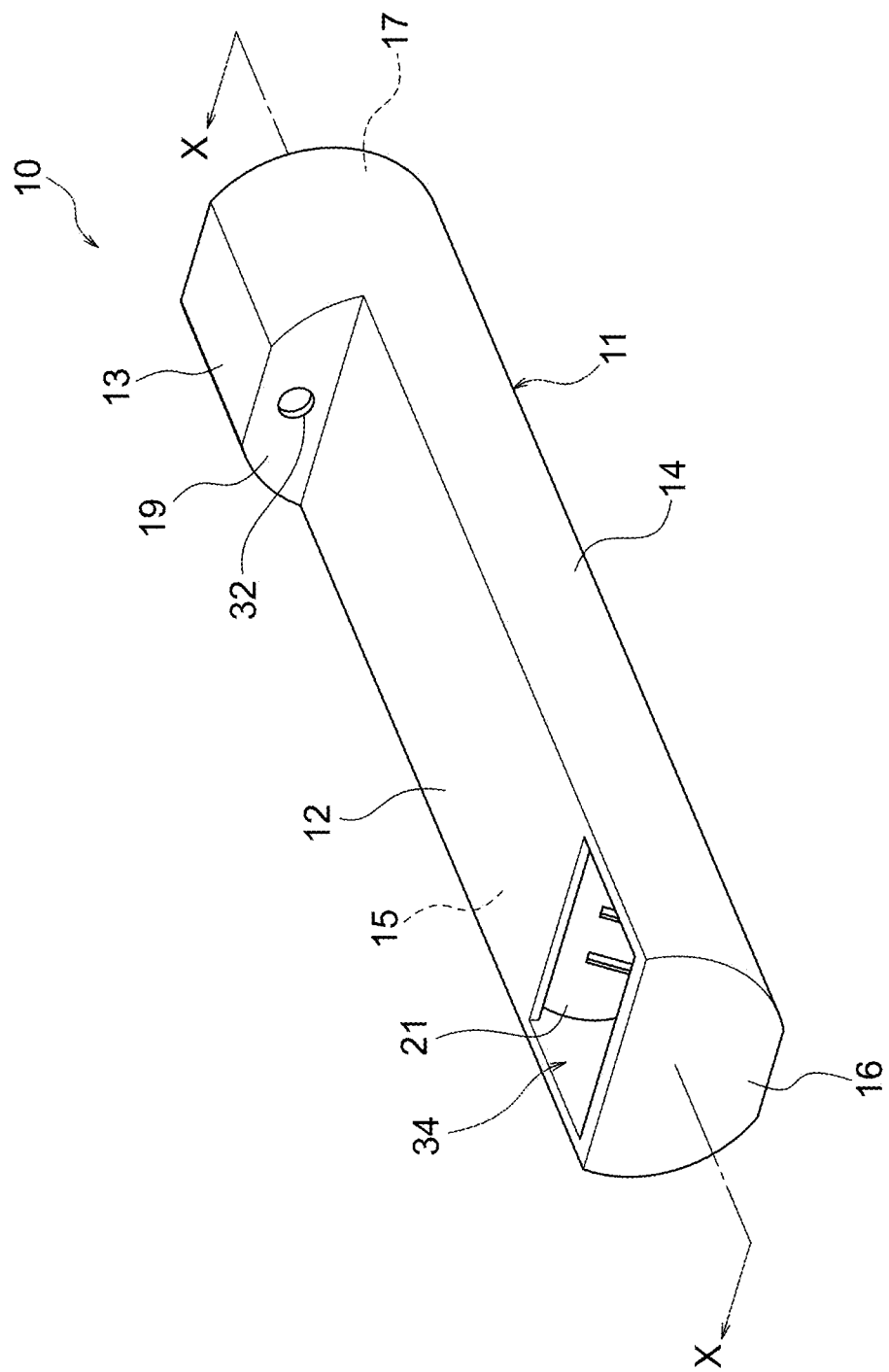
FIG. 1 is a schematic perspective view of a vapor-liquid reaction device according to a first exemplary embodiment.

Herein, numerical ranges expressed in the format "from A to B" are inclusive ranges in which the numerical values A and B respectively correspond to a lower limit value and an upper limit value thereof.

Vapor-Liquid Reaction Device

A vapor-liquid reaction device of the present disclosure includes a vapor-liquid reaction chamber and a projecting member. Molten metal is held in a lower portion of an internal space of the vapor-liquid reaction chamber. A produced gas is produced by a vapor-liquid reaction between a source gas and the molten metal while a mixed gas A, supplied to an upper portion at one end side in a length direction of the internal space and containing the source gas and a carrier gas that is at least one gas out of nitrogen gas or argon gas, is flowing along the length direction. A mixed gas B containing the produced gas and the carrier gas is discharged from the upper portion at another end side in the length direction of the internal space. The projecting member projects into the internal space from a ceiling face adjoining the internal space of the vapor-liquid reaction chamber at a projection angle that is an obtuse angle on the length direction one end side of the projecting member, and includes a slit allowing passage of gas along the length direction.

The vapor-liquid reaction device of the present disclosure employs at least one gas out of nitrogen gas or argon gas (hereafter also referred to as "nitrogen gas and/or argon gas") as the carrier gas.

Generally, as stated above, when nitrogen gas and/or argon gas is employed as the carrier gas in a vapor-liquid reaction device the issue of insufficient gas mixing in the vertical direction may arise. More specifically, an issue might arise in which a layered flow develops in the flow of gas, with an upper flow layer (i.e. a flow on a side not contacting the molten metal) containing the source gas, and a lower flow layer (i.e. a flow on a side contacting the molten metal) containing the produced gas, impeding the vapor-liquid reaction.

However, in the vapor-liquid reaction device of the present exemplary embodiment the projecting member promotes mixing of the gas in the vertical direction (more specifically mixing of the mixed gas A and the mixed gas B in the vertical direction; the same applies hereafter), thereby enabling contact between the source gas and the molten metal to be promoted, and as a result the reaction between the molten metal and the source gas can be promoted.

More specifically, the projecting member is a member projecting into the internal space from the ceiling face adjoining the internal space of the vapor-liquid reaction chamber (hereafter also referred to simply as the "internal space") at a projection angle that is an obtuse angle (i.e. greater than 90° but less than 180°) on the one end side (hereafter also referred to as the "upstream side") of the projection member in the length direction of the internal space. The projecting member is thereby able to redirect the flow direction of the mixed gas A by an obtuse angle (in other words, so as to be inclined gently downwards). This promotes gas mixing in the vertical direction, and enables a phenomenon in which the mixed gas A lingers in an upstream region that is a region in proximity to a contact portion between the projecting member and the ceiling face (hereafter also referred to as "an upper portion region upstream of the projecting member") to be suppressed. More specifically, if the projection angle at the upstream side of the projecting member is either an acute angle or perpendicular, excessive eddying arises in the upper portion region upstream of the projecting member, and the mixed gas A may linger in this region.

The vapor-liquid reaction device of the present disclosure enables contact between the source gas and the molten metal to be promoted by promoting gas mixing in the vertical direction using the projecting member described above. Moreover, by being able to suppress the mixed gas A from lingering in the upper portion region upstream of the projecting member, a reaction between the molten metal and the source gas can be promoted even when nitrogen gas and/or argon gas are used as the carrier gas.

With regard to gas mixing in the vertical direction, Patent Document 2 (JP-A No. 2016-44341) describes a device including a partition member to partition a space inside a vessel and a separately provided flow rectification mechanism (for example a flow rectification plate) to cause gas to flow toward the liquid surface of a liquid raw material. Gas may therefore linger inside the device (and in particular at the upstream side of the partition member) in the device described in Patent Document 2.

With regard to this issue of lingering gas, in the vapor-liquid reaction device of the present disclosure the slit allowing the passage of gas along the length direction of the internal space is formed in the above-described projecting member.

Thus in the vapor-liquid reaction device of the present disclosure, gas is suppressed from lingering inside the device (i.e. inside the vapor-liquid reaction chamber) by the slit formed in the projecting member.

The ability to suppress gas from lingering inside the device is also advantageous from perspectives such as being able to suppress a drop in the discharge rate of the mixed gas B to outside of the vapor-liquid reaction chamber, being able to suppress a rise in the pressure inside the vapor-liquid reaction chamber, and being able to suppress leakage of the source gas to outside of the vapor-liquid reaction chamber accompanying a rise in pressure inside the vapor-liquid reaction chamber.

The projection angle at the upstream side of the projecting member (hereafter also referred to as "projection angle θ1") is an obtuse angle (i.e. greater than 90° but less than) 180°.

The projection angle θ1 is preferably from 100° to 170°, is more preferably from 110° to at least 160°, and is even more preferably from 120° to 150°.

A projection angle θ1 of at least 100° suppresses excessive eddying in the upper portion region upstream of the projecting member, and as a result suppresses the mixed gas A from lingering in the upper portion region upstream of the projecting member.

A projection angle θ1 of no greater than 170° better promotes gas mixing in the vertical direction.

Herein, the projection angle at the upstream side of the projecting member (i.e. at the length direction one end side of the internal space) refers to an angle formed between a region of the ceiling face on the upstream side as viewed from the projecting member and an upstream face of the projecting member, or between a virtual plane extending the ceiling face toward the upstream side and the upstream face of the projecting member.

More detailed explanation follows regarding the virtual plane.

The projecting member may be provided at an upstream side terminal end of the ceiling face.

In cases in which the projecting member is provided at the upstream side terminal end of the ceiling face, the projection angle on the upstream side of the projecting member is the angle formed between a virtual plane extending the ceiling face toward the upstream side and the upstream face of the projecting member.

Note that in cases in which the projecting member is provided to a portion other than at the upstream side terminal end of the ceiling face, the angle formed between the region of the ceiling face on the upstream side as viewed from the projecting member and the upstream face of the projecting member matches the angle formed between a virtual plane extending the ceiling face toward the upstream side and the upstream face of the projecting member.

From the perspective of exploiting the advantageous effect of the projecting member to greater effect, the projecting member preferably includes a plate-shaped member projecting from the ceiling face into the internal space, and more preferably is configured from a plate-shaped member projecting from the ceiling face into the internal space.

In an embodiment in which the projecting member includes such a plate-shaped member, the projection angle referred to above is the angle formed between the region of the ceiling face on the upstream side as viewed from the plate-shaped member and the upstream face of the plate-shaped member, or between a virtual plane extending the ceiling face toward the upstream side and the upstream face of the projecting member.

The plate-shaped member preferably includes a bent portion bent toward the upstream side with respect to a projection direction of the plate-shaped member from the ceiling face into the internal space. This better promotes gas mixing in the vertical direction.

The bent portion may bend gently with a given radius of curvature in a cross-section sectioned parallel to the length direction of the internal space and perpendicular to a width direction thereof, or may be folded at a given angle.

Herein the "bent portion" indicates the entirety of a portion bent upstream with respect to the projection direction of the plate-shaped member from the ceiling face into the internal space (i.e. everything from a portion where bending starts to a leading end of the plate-shaped member).

Such a plate-shaped member includes a projecting portion projecting from the ceiling face into the internal space and the bent portion, and the angle formed between the region of the ceiling face on the upstream side as viewed from the projecting member and the upstream face of the bent portion, or between a virtual plane extending the ceiling face toward the upstream side and the upstream face of the bent portion (hereafter also referred to as angle θ2), is preferably from 70° to 110°.

In other words, an angle of the upstream face of the bent portion with respect to the ceiling face preferably lies within a range of 90°±20°.

An angle θ2 of at least 70° suppresses excessive eddying, and as a result further suppresses the mixed gas A from lingering in the upper portion region upstream of the projecting member.

An angle θ2 of no greater than 110° better promotes gas mixing in the vertical direction.

The angle θ2 is more preferably from 80° to 100°, and is particularly preferably from 85° to 95°.

A length of the slit in the width direction of the internal space is preferably from 2% to 50% of a width direction length of the internal space, is more preferably from 5% to 30% thereof, and is still more preferably from 10% to 15% thereof.

In cases in which the length of the slit is at least 2% of the width direction of the internal space, the function of the slit (i.e. the function to secure a flow of gas in the internal space) is exploited to greater effect, and as a result lingering of gas inside the device is more effectively suppressed.

In cases in which the length of the slit is no greater than 50% of the width direction of the internal space, time for the vapor-liquid reaction (i.e. the reaction between the molten metal and the reaction gas) to occur is more readily secured, and as a result the reaction between the molten metal and the reaction gas can be better promoted.

In cases in which the width direction of the internal space is aligned with the width direction of the slit, the length of the slit in the width direction of the internal space corresponds to the width direction length of the slit.

The slit is preferably a notch formed by notching from a leading end side of the projecting member (i.e. the side furthest from the ceiling face) toward a base side of the projecting member (i.e. the side of a portion joined to the ceiling face).

Figure 4:
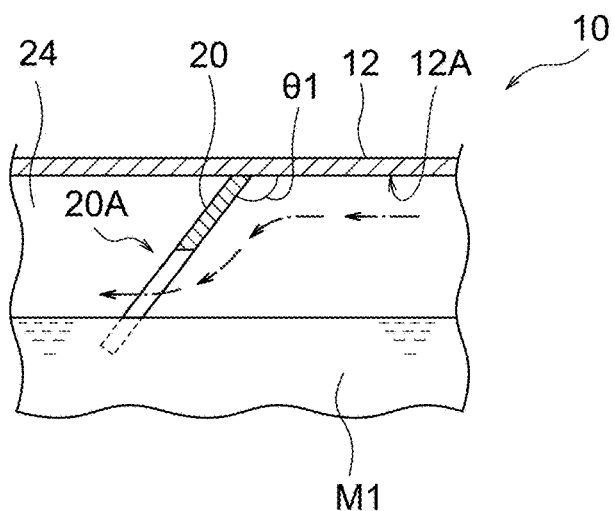
FIG. 4 is an enlarged partial view of FIG. 2.
Figure 5:
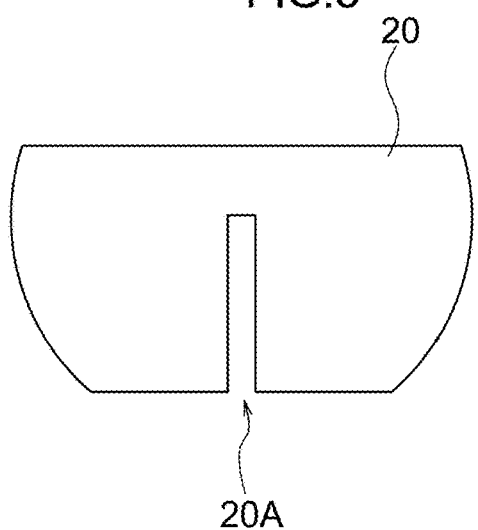
FIG. 5 is a schematic plan view of one plate-shaped member in the first exemplary embodiment.
Figure 6:
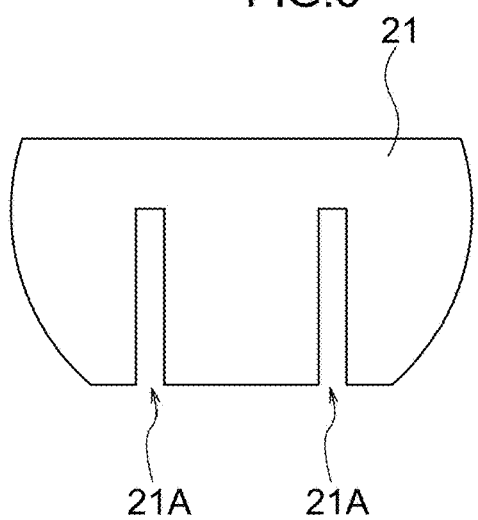
FIG. 6 is a schematic plan view of another plate-shaped member in the first exemplary embodiment.

In such cases, a lower end portion of the slit (i.e. an end portion at the leading end side of the projecting member) is an open end, and the upper end portion of the slit (i.e. the end portion at the base side of the projecting member) is a closed end (see, for example, FIG. 4 to FIG. 6).

In such a preferable embodiment, gas readily passes in the vicinity of the liquid surface of the molten metal due to the lower end portion of the slit being an open end and the upper end portion of the slit being a closed end, thereby better promoting the reaction between the molten metal and the reaction gas.

The length direction of the slit is preferably a direction from the leading end side of the projecting member toward the base side of the projecting member.

In cases in which the length direction of the slit is the direction described above, gas passing through the slit passes through the projecting member more readily, and as a result lingering of gas inside the device is more effectively suppressed.

A preferable embodiment of the vapor-liquid reaction device of the present disclosure is provided with plural of the projecting members (for example, the plate-shaped members), in a mode in which the plural projecting members are arrayed along the length direction of the internal space (hereafter also referred to as the "X mode").

The X mode enables the advantageous effects of the projecting members to be exploited to greater effect.

In this X mode, the number of the plural (i.e. two or more) projecting members is preferably from 2 to 30, is more preferably from 4 to 20, and is particularly preferably from 6 to 10.

As the X mode, a preferable arrangement (hereafter also referred to as the "XX mode" is an arrangement in which the slits in an adjacent pair of the projecting members out of the plural projecting members are arranged at positions that do not overlap with each other when viewed from the length direction one end side of the internal space.

In the XX mode, if the adjacent pair of projecting members are denoted a projecting member A and a projecting member B in this sequence from the upstream side, gas that has passed through the slit formed in the projecting member A is mixed in the vertical direction by the projecting member B. The gas that has been mixed then passes through the slit formed in the projecting member B. In cases in which there is a projecting member present further downstream with respect to the projecting member B (hereafter referred to as "projecting member C") then the gas that has passed through the slit formed in the projecting member B is mixed in the vertical direction by the projecting member C.

Due to adopting such a configuration, the XX mode performs gas mixing in the vertical direction more effectively over the internal space overall.

In the vapor-liquid reaction device of the present disclosure, an example of a combination of the molten metal, the source gas, and the produced gas is a combination in which the molten metal is gallium, the source gas is at least one out of chlorine gas or hydrogen chloride gas (preferably chlorine gas, a mixed gas of chlorine gas and hydrogen chloride gas, and more preferably chlorine gas), and the produced gas is gallium (I) chloride gas.

Other examples of such combinations include: a combination in which the molten metal is aluminum, the source gas is at least one gas out of chlorine gas or hydrogen chloride gas (preferably chlorine gas or a mixed gas of chlorine gas and hydrogen chloride gas, and more preferably chlorine gas), and the produced gas is aluminum (I) chloride gas (AlCl); or a combination in which the molten metal is indium (In), the source gas is at least one gas out of chlorine gas or hydrogen chloride gas (preferably chlorine gas or a mixed gas of chlorine gas and hydrogen chloride gas, and more preferably chlorine gas), and the produced gas is indium (I) chloride gas (InCl).

In the vapor-liquid reaction device of the present disclosure, a mode with the combination of gallium (Ga) as the molten metal, chlorine gas ($Cl_2$) as the source gas, and gallium (I) chloride gas (GaCl) as the produced gas is preferably employed as a configuration member in a film forming apparatus to form a gallium nitride film using THVPE.

Exemplary Embodiments of Vapor-Liquid Reaction Device

Exemplary embodiments of a vapor-liquid reaction device of the present disclosure will be described, with reference to the drawings. The vapor-liquid reaction device of the present disclosure is, however, not limited to the following exemplary embodiments.

Note that throughout the drawings the same reference numerals are appended to elements that are substantially the same as each other, and duplicate explanation thereof will be omitted.

First Exemplary Embodiment

Figure 2:
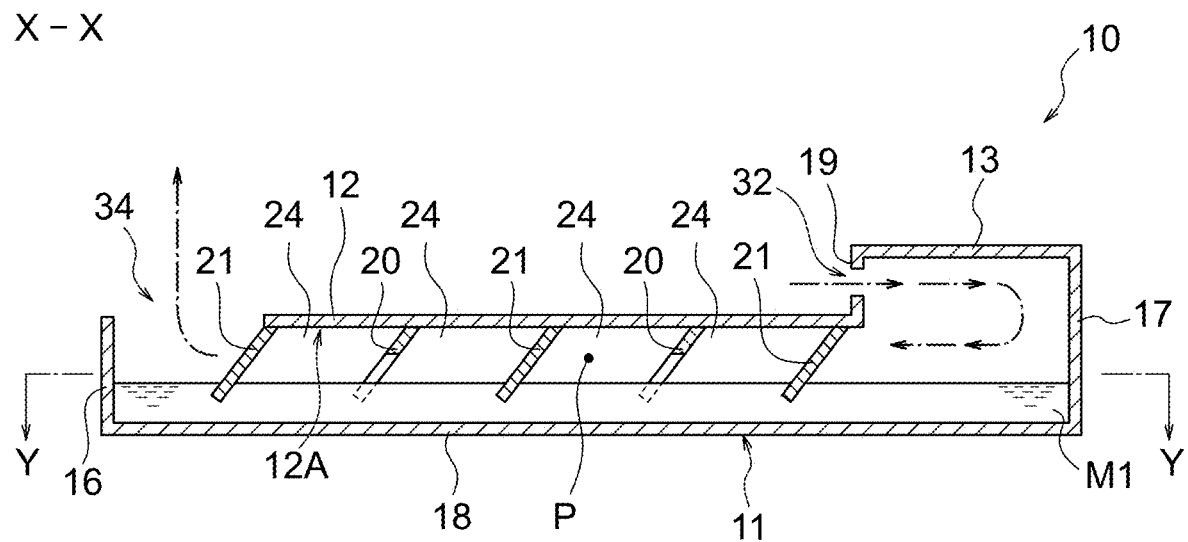
FIG. 2 is a cross-section taken along line X-X in FIG. 1.
Figure 3:
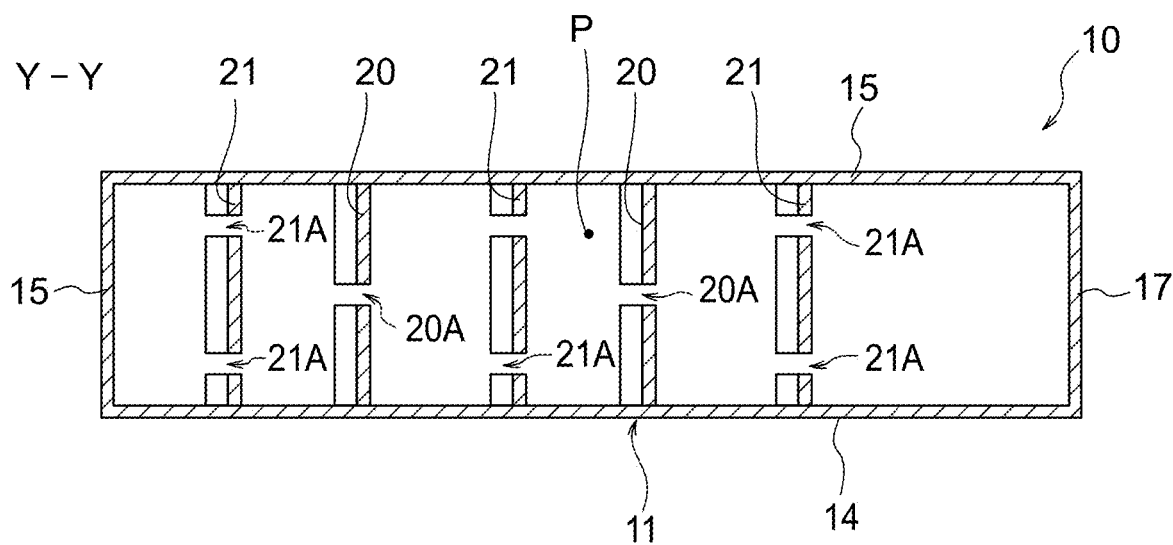
FIG. 3 is a cross-section taken along line Y-Y in FIG. 2.

FIG. 1 is a schematic perspective view of a vapor-liquid reaction device according to a first exemplary embodiment. FIG. 2 is a cross-section taken along line X-X in FIG. 1, FIG. 3 is a cross-section taken along line Y-Y in FIG. 2, and FIG. 4 is an enlarged partial view of FIG. 2.

As illustrated in FIG. 1 and FIG. 2, a vapor-liquid reaction device 10 according to the first exemplary embodiment includes a vapor-liquid reaction chamber 11.

The vapor-liquid reaction chamber 11 is configured from a bottom plate 18, two top plates (top plate 12 and top plate 13) arranged at different heights from the bottom plate 18 and arrayed along the length direction of the vapor-liquid reaction chamber 11, a connecting plate 19 connecting the top plate 12 and the top plate 13 together, a pair of side plates (side plate 14 and side plate 15) connecting the bottom plate 18 to the two top plates (top plate 12 and top plate 13), one end plate 17 arranged at a length direction one end side of the vapor-liquid reaction chamber 11, and another end plate 16 arranged at a length direction other end side of the vapor-liquid reaction chamber 11.

In the vapor-liquid reaction chamber 11, an internal space 24 is demarcated by the bottom plate 18, the top plate 12, the top plate 13, the connecting plate 19, the side plate 14, the side plate 15, the one end plate 17, and the other end plate 16. Each of these plates is made from quartz.

A molten metal M1 is held in a lower portion inside the internal space 24.

A gas (more specifically at least one gas out of a mixed gas A or a mixed gas B) flows through an upper portion inside the internal space 24 (above the molten metal M1) from the one end side toward the other end side.

The top plate 13 is arranged at the one end side (i.e. upstream) of the top plate 12. The height from the bottom plate 18 to the top plate 13 is higher than the height from the bottom plate 18 to the top plate 12.

The one end side of the top plate 12 and the other end side of the top plate 13 are connected together by the connecting plate 19.

A gas supply port 32 is formed in the connecting plate 19.

In the vapor-liquid reaction device 10, the mixed gas A containing a source gas and a carrier gas that is at least one gas out of nitrogen gas and/or argon gas is supplied through the gas supply port 32 into the upper portion at the one end side inside the internal space 24 of the vapor-liquid reaction chamber 11.

More specifically, the mixed gas A is first supplied into the upper portion at the one end side inside the internal space 24 through the gas supply port 32 in a direction from the other end side toward the one end side. The supplied mixed gas A changes direction to a direction different to the supply direction (i.e. to a direction from the one end side toward the other end side) (see the single-dotted broken line arrow in FIG. 2), and flows through the internal space 24 from the one end side (upstream) toward the other end side (downstream).

In the vapor-liquid reaction chamber 11, a gas discharge port 34 is formed by the length direction other end of the top plate 12, the other end plate 16, the side plate 14, and the side plate 15.

In the vapor-liquid reaction device 10 the mixed gas B, configured by the produced gas produced by a vapor-liquid reaction inside the internal space 24 and the carrier gas, passes through the gas discharge port 34, and is discharged to outside the internal space 24 (i.e. to outside the vapor-liquid reaction chamber 11).

As illustrated in FIG. 2, the vapor-liquid reaction device 10 includes plural plate-shaped members 21 and plural plate-shaped members 20 as projecting members projecting from a ceiling face adjoining the internal space 24 of the vapor-liquid reaction chamber 11 into the internal space 24. The plural plate-shaped members 21 and the plural plate-shaped members 20 are each made from quartz. The ceiling face is a surface on the side of the top plate 12 adjoining the internal space 24 (i.e. a ceiling face 12A in FIG. 4, described later).

The plural plate-shaped members 21 and the plural plate-shaped members 20 are arranged alternately along the length direction of the internal space, and are each welded to the ceiling face.

A leading end of each of the plural plate-shaped members 21 and the plural plate-shaped members 20 is immersed in the molten metal M1 but does not contact the bottom plate 18. Each of the plural plate-shaped members 21 and the plural plate-shaped members 20 contacts the side plates 14 and 15.

Slits (slits 21A, described later) are formed in each of the plural plate-shaped members 21 to allow gas to pass through along the length direction of the internal space. A slit (slit 20A, described later) is formed in each of the plural plate-shaped members 20 to allow gas to pass through along the length direction of the internal space.

In the vapor-liquid reaction device 10, a flow of gas through the internal space 24 is secured by the slits respectively provided in the plural plate-shaped members 21 and the plural plate-shaped members 20. Gas is accordingly suppressed from lingering inside the internal space 24 (i.e. inside the device).

The positions and numbers of the slits formed in the respective plate-shaped members differs between the plate-shaped members 21 and the plate-shaped members 20. This point is explained in more detail later.

As illustrated in FIG. 4 which is an enlarged partial view of FIG. 2, a projection angle θ1 at the upstream side of each of the plate-shaped members 20 is an obtuse angle (i.e. exceeds 90° but is less than 180°). Preferable ranges of the projection angle θ1 are as previously stated.

The projection angle θ1 is an angle formed between a region of the ceiling face 12A on the upstream side as viewed from the plate-shaped member 20 and the upstream face of the plate-shaped member 20, or between a virtual plane extending the ceiling face 12A toward the upstream side and the upstream face of the plate-shaped member 20.

By making the projection angle θ1 at the upstream side of each of the plate-shaped members 20 an obtuse angle, the flow direction of the gas is redirected gently downward to follow the surface of the plate-shaped member 20. This gas then passes through the slit 20A formed in the plate-shaped member 20 (see the single-dotted broken line arrow in FIG. 4).

The shape of the plate-shaped members 21 is similar to the shape of the plate-shaped members 20, differing only in the position and number of slits therein.

FIG. 5 is a schematic plan view of the plate-shaped member 20, and FIG. 6 is a schematic plan view of the plate-shaped member 21.

As illustrated in FIG. 5, one of the slits 20A is formed in each of the plate-shaped members 20 to allow gas to pass through in the length direction of the internal space at a position corresponding to a width direction central portion of the internal space 24.

However, as illustrated in FIG. 6, two of the slits 21A are formed in each of the plate-shaped members 21 to allow gas to pass through in the length direction of the internal space at positions separated from a position corresponding to the width direction central portion of the internal space 24.

In the vapor-liquid reaction device 10, the slit 20A and the two slits 21A in an adjacent pair of the plate-shaped members 20 and 21 are arranged at positions that do not overlap with each other when viewed from the length direction one end side of the internal space 24.

As viewed from the length direction one end side of the internal space 24, the slit 20A and the two slits 21A each have a shape with a length direction along the vertical direction (i.e. the direction of gravity) and with a width direction along the width direction of the internal space.

Moreover, as illustrated in FIG. 4 to FIG. 6, each of the slits (i.e. each of the slit 20A and the two slits 21A) is configured by a notch notched from the leading end side (i.e. from the side furthest from the ceiling face 12A in FIG. 4) of the plate-shaped member (either the plate-shaped member 20 or 21; similar applies below) toward the base side of the plate-shaped member (i.e. the side of a portion joined to the ceiling face 12A in FIG. 4). In other words, a lower end portion of each of the slits (i.e. the end portion on the leading end side of the plate-shaped member) is accordingly an open end, and an upper end portions of each of the slits (i.e. the end portion of the base side of the plate-shaped member) is accordingly a closed end.

Adopting such a configuration facilitates the passage of gas in the vicinity of the liquid surface of the molten metal M1, and as a result better promotes a reaction between the molten metal M1 and the reaction gas.

Moreover, as illustrated in FIG. 4 to FIG. 6, the length direction of each of the slits is a direction from the leading end side of the plate-shaped member toward the base side of the plate-shaped member.

Adopting such a configuration further facilitates the passage of gas through the projecting members via the respective slits, and as a result gas is more effectively suppressed from lingering inside the device.

Explanation follows regarding operation of the vapor-liquid reaction device 10.

In the vapor-liquid reaction device 10 the molten metal M1 is held in a lower portion of the internal space 24 of the vapor-liquid reaction chamber 11, as stated above.

In such a state, the mixed gas A containing the source gas and the carrier gas that is at least one gas out of nitrogen gas and/or argon gas is supplied through the gas supply port 32 into the upper portion at the one end side in the length direction inside the internal space 24. More specifically, the mixed gas A is first supplied into the upper portion at the one end side (i.e. upstream) inside the internal space 24, and passes through the gas supply port 32 in a direction from the other end side (i.e. downstream) toward the one end side (i.e. upstream).

The mixed gas A supplied into the upper portion at the one end side inside the internal space 24 accordingly changes direction to the opposite direction to the supply direction (i.e. to a direction from the one end side (i.e. upstream) toward the other end side (i.e. downstream) (see the single-dotted broken line arrow in FIG. 2) and thus reaches a position immediately ahead of the first of the plate-shaped members (i.e. the first of the plate-shaped members 21).

The flow of the mixed gas A that has reached a position immediately ahead of the first of the plate-shaped members 21 is redirected gently downwards (in a direction toward the liquid surface of the molten metal M1) to follow the plate-shaped member 21 projecting out into the internal space at an obtuse angle. Gas mixing in the vertical direction is thereby promoted, thus promoting contact between the source gas in the mixed gas A and the molten metal M1. As a result thereof, a vapor-liquid reaction between the source gas and the molten metal M1 is promoted, producing the produced gas. The gas containing the produced gas and the source gas (hereafter also referred to simply as "gas") passes through the two slits 21A formed in the first of the plate-shaped members 21, and reaches a position immediately ahead of the next plate-shaped member (i.e. the first of the plate-shaped members 20).

The flow of gas that has reached immediately ahead of the first of the plate-shaped members 20 is redirected gently downwards (in a direction toward the liquid surface of the molten metal M1) to follow the plate-shaped member 20 projecting out into the internal space at an obtuse angle. Gas mixing in the vertical direction is thereby promoted, thus promoting contact between the source gas in the gas and the molten metal M1. As a result thereof, a vapor-liquid reaction between the source gas in the gas and the molten metal M1 is promoted. The concentration of produced gas in the gas thus increases, and the concentration of the source gas in the gas decreases. The gas then passes through the slit 20A formed in the first of the plate-shaped members 20.

Thus in the vapor-liquid reaction device 10, every time the gas passes through a plate-shaped member, the concentration of the produced gas in the gas increases, and the concentration of the source gas in the gas decreases.

The gas that has passed through the two slits 21A in the last of the plate-shaped members 21 (i.e. the mixed gas B containing produced gas at high concentration and carrier gas) passes through the gas discharge port 34, and is discharged to outside the internal space 24 (i.e. to outside the vapor-liquid reaction chamber 11).

Thus in the vapor-liquid reaction device 10 gas mixing in the vertical direction is promoted by the plate-shaped members (the plural plate-shaped members 21 and the plural plate-shaped members 20) serving as projecting members, enabling contact between the source gas and the molten metal to be promoted.

The vapor-liquid reaction device 10 employs nitrogen gas and/or argon gas as the carrier gas. Thus, were the projecting members (the plate-shaped members 20 and 21) to be omitted from the vapor-liquid reaction device 10, an issue of insufficient gas mixing in the vertical direction might arise, resulting in a layered flow of gas which would impede the vapor-liquid reaction.

The vapor-liquid reaction device 10 however is equipped with the projecting members (the plate-shaped members 20 and 21) and so is able to eliminate such an issue.

Furthermore, in the vapor-liquid reaction device 10, due to the projection angle of each of the plate-shaped members 20 and 21 being set to an obtuse angle, gas can be suppressed from lingering in upper portion regions upstream of each of the plate-shaped members.

The issue of gas lingering in the upper portion regions upstream of each of the plate-shaped members can be illustrated with reference to a comparative embodiment described below.

Furthermore, in the vapor-liquid reaction device 10, gas is better suppressed from lingering inside the device due to each of the plate-shaped members 20 and 21 including the slits (the slits 20A and the slits 21A) than in cases in which there are no slits present in the plate-shaped members or cases in which the plate-shaped members include through holes in place of slits.

The ability to suppress gas from lingering inside the device is advantageous from perspectives such as being able to suppress a drop in the discharge rate of gas (i.e. the mixed gas B) to outside of the vapor-liquid reaction chamber 11, being able to suppress a rise in the pressure inside the device, and being able to suppress leakage of the source gas to outside the vapor-liquid reaction chamber accompanying a rise in pressure inside the device.

Furthermore, in the vapor-liquid reaction device 10, due to the provision of plural projecting members (plate-shaped members), gas mixing in the vertical direction is better promoted than in cases in which only one projecting member is provided.

Furthermore, the respective slit 20A and two slits 21A in an adjacent pair of the plate-shaped members 20 and 21 are arranged in the vapor-liquid reaction device 10 at positions that do not overlap with each other when viewed from the length direction one end side of the internal space 24. Gas that has passed through the slits in a given plate-shaped member is accordingly mixed in the vertical direction by the next (downstream) plate-shaped member so as to better promote gas mixing in the vertical direction.

The vapor-liquid reaction device 10 is accordingly an example of the XX mode described above (i.e. a mode in which the slits in an adjacent pair of the projecting members out of plural projecting members are arranged at positions that do not overlap with each other when viewed from the length direction one end side of the internal space).

Moreover, in the vapor-liquid reaction device 10 the leading ends of each of the plural plate-shaped members 21 and the plural plate-shaped members 20 are immersed in the molten metal M1. The advantageous effects (more specifically the advantageous effect of promoting gas mixing in the vertical direction) of the plural plate-shaped members 21 and the plural plate-shaped members 20 are thereby exploited to greater effect.

Moreover, in the vapor-liquid reaction device 10, the mixed gas A supplied in the direction from the other end side to the one end side changes direction (see the single-dotted broken line arrow in FIG. 2) to a direction different from the supply direction (i.e. to a direction from the one end side to the other end side), and flows in the direction from the one end side to the other end side inside the internal space 24. This enables the dwell time of the gas over the molten metal M1 to be prolonged, better promoting the vapor-liquid reaction between the molten metal M1 and the source gas.

Moreover, in the vapor-liquid reaction device 10 the shapes of the side plate 14 and the side plate 15 are curved shapes in cross-section perpendicular to the length direction of the internal space 24, each curving in a direction bulging out from the middle of the internal space 24 toward the outside.

However, the respective shapes of the side plate 14 and the side plate 15 are not limited to such curved shapes, and for example, may be planar shapes (flat plate shapes).

Explanation has been given above of the vapor-liquid reaction device 10 according to the first exemplary embodiment. However, the vapor-liquid reaction device of the present disclosure is not limited to the first exemplary embodiment (the vapor-liquid reaction device 10).

Explanation follows regarding modified examples of the first exemplary embodiment.

In the vapor-liquid reaction device 10, the plate-shaped members 20 (projecting members) with a single slit and the plate-shaped members 21 (projecting members) with two slits are arranged alternately along the length direction of the internal space 24. However, the vapor-liquid reaction device of the present disclosure is not limited to such an embodiment.

For example, the vapor-liquid reaction device of the present disclosure may include only plural projecting members (for example plate-shaped members) with a single slit arranged along the length direction, may include only plural projecting members (for example plate-shaped members) with two slits arranged along the length direction, may include projecting members (for example plate-shaped members) with one or two slits arranged alternately with projecting members (for example plate-shaped members) with three or more slits, or may include only plural projecting members (for example plate-shaped members) with three or more slits arranged along the length direction.

In such cases too, as long as the XX mode is satisfied (i.e. a mode in which the slits in an adjacent pair of the projecting members out of plural projecting members are arranged at positions that do not overlap with each other when viewed from the length direction one end side of the internal space), similar advantageous effects to those of the XX mode (i.e. the advantageous effect of more effectively performing gas mixing in the vertical direction over the internal space as a whole) can be obtained.

Moreover, although in the vapor-liquid reaction device 10 the leading ends of the plate-shaped members 20 and 21 are immersed in the molten metal M1, configuration may be made in which the leading end of one or more of the plural plate-shaped members is not immersed in the molten metal M1. Moreover, the leading end of one or more of the plural plate-shaped members may contact the bottom plate 18.

One or more out of the plural plate-shaped members may be configured to contact the side plate 14 and/or the side plate 15, or may be configured not to contact the side plate 14 and/or the side plate 15.

In the vapor-liquid reaction device of the present disclosure, even in embodiments other than that of the vapor-liquid reaction device 10, the advantageous effect of prolonging the dwell time of the gas over the molten metal M1 can be obtained in cases in which a direction of supply of the mixed gas A is a different direction to a flow direction of the gas (a direction from the one end side to the other end side).

For example, the advantageous effect of prolonging the dwell time of the gas over the molten metal M1 can also be obtained in cases in which the position where the gas supply port is formed is changed to a position on the top plate 13, the side plate 14, or the side plate 15.

The vapor-liquid reaction device of the present disclosure may be provided with plural gas supply ports.

Moreover, the vapor-liquid reaction device may also be equipped with a gas supply pipe inserted into the gas supply port 32 to supply the mixed gas A into the internal space.

Moreover, although in the vapor-liquid reaction device 10 the gas discharge port 34 is formed by the length direction other end of the top plate 12, the other end plate 16, the side plate 14, and the side plate 15, a gas discharge port may be formed as a through hole penetrating the top plate 12, the side plate 14, or the side plate 15.

There may, moreover, be plural of the gas discharge ports provided.

Furthermore, the vapor-liquid reaction chamber 11 may, in addition to the gas supply port and the gas discharge port, also include a supply port to supply the molten metal M1.

Although quartz is employed as the material of each of the members of the vapor-liquid reaction chamber 11, instead of quartz, graphite, boron nitride (BN), sapphire, silicon carbide (SiC) or the like may also be employed as the material for each of the members.

The shape of the vapor-liquid reaction chamber 11 may be an elongated shape other than the shape illustrated in FIG. 1 to FIG. 3.

For example, the shapes of the vapor-liquid reaction chamber and the internal space may be tubular shapes such as a circular tubular shape, elliptical tubular shapes, square tubular shapes, or the like.

Moreover, the size of the internal space 24 of the vapor-liquid reaction chamber 11 is not particularly limited.

The length direction length of the internal space 24 is preferably from 20 mm to 1000 mm, is more preferably from 50 mm to 500 mm, and is even more preferably from 100 mm to 300 mm.

The width direction length of the internal space 24 (a length in a direction orthogonal to the vertical direction and the length direction) is preferably from 10 mm to 300 mm, is more preferably from 30 mm to 100 mm, and is even more preferably from 50 mm to 70 mm.

The volume of the internal space 24 is preferably from 1000 $mm^3$ to 35,000,000 $mm^3$, is more preferably from 18,000 $mm^3$ to 2,000,000 $mm^3$, and is even more preferably from 100,000 $mm^3$ to 600,000 $mm^3$.

The shape and size of the slits provided in each of the plural plate-shaped members 21 and the plural plate-shaped members 20 is set appropriately in consideration of the cross-sectional area of the flow path of the gas formed by the slits.

The length of the slits in the width direction of the internal space 24 (the width direction length of the slits when the width direction of the internal space 24 matches the width direction of the slits) is preferably from 2% to 50% of the width direction length of the internal space 24, is more preferably from 5% to 30% thereof, and is even more preferably from 10% to 15% thereof.

When the length of the slits is not less than 2% of the width direction of the internal space 24, the function of the slits (i.e. the function to secure the flow of gas inside the internal space 24) is exploited to greater effect, and as a result gas is more effectively suppressed from lingering inside the device.

When the length of the slits is not more than 50% of the width direction of the internal space 24, time for the vapor-liquid reaction (i.e. reaction between the molten metal and the reaction gas) to occur is more readily secured, and as a result the reaction between the molten metal and the reaction gas can be better promoted.

The length of the slits in the width direction of the internal space 24 (the width direction length of the slits when the width direction of the internal space 24 matches the width direction of the slits) is preferably from 1.5 mm to 35 mm, is more preferably from 3.5 mm to 21 mm, and is even more preferably from 7 mm to 10 mm.

When the length of the slits in the width direction of the internal space 24 is not less than 1.5 mm, the function of the slits (i.e. the function to secure a flow of gas inside the internal space 24) is exploited to greater effect, and as a result gas is more effectively suppressed from lingering inside the device.

When the length of the slits in the width direction of the internal space 24 is not greater than 35 mm, time for the vapor-liquid reaction (i.e. reaction between the molten metal and the reaction gas) to occur is more readily secured, and as a result the reaction between the molten metal and the reaction gas can be better promoted.

Moreover, a height from the liquid surface of the molten metal to upper ends of the slits is preferably from 1.0 mm to 20 mm, is more preferably from 1.0 mm to 10 mm, and is even more preferably from 1.0 mm to 5 mm.

When the height from the liquid surface of the molten metal to the upper ends of the slits is not less than 1.0 mm, the function of the slits (i.e. the function to secure a flow of gas inside the internal space 24) is exploited to greater effect, and as a result gas is more effectively suppressed from lingering inside the device.

When the height from the liquid surface of the molten metal to the upper ends of the slits is not more than 20 mm, time for the vapor-liquid reaction (i.e. reaction between the molten metal and the reaction gas) to occur is more readily secured, and as a result the reaction between the molten metal and the reaction gas can be better promoted.

Second Exemplary Embodiment

Figure 7:
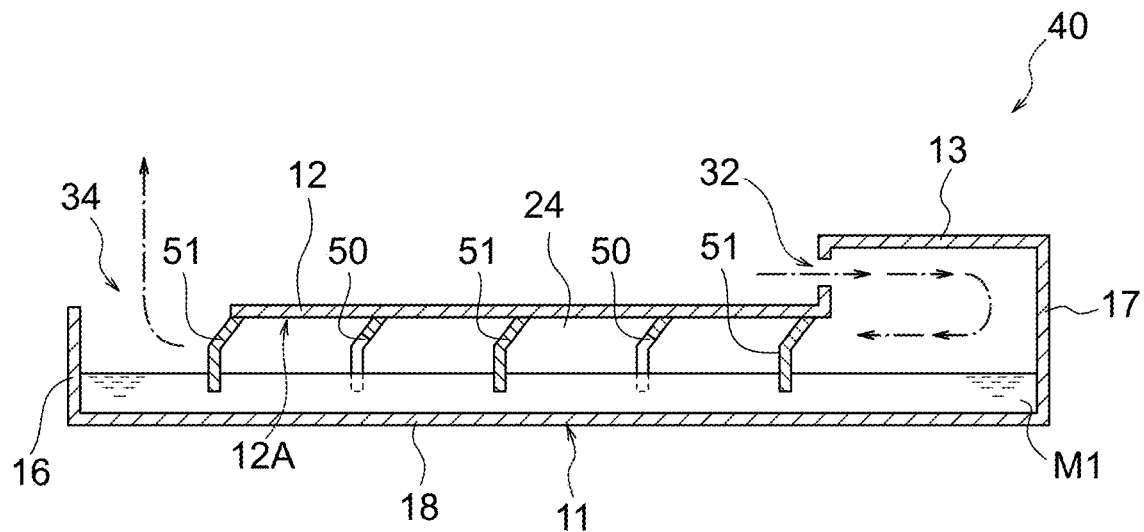
FIG. 7 is a schematic cross-section illustrating a vapor-liquid reaction device according to a second exemplary embodiment.
Figure 8:
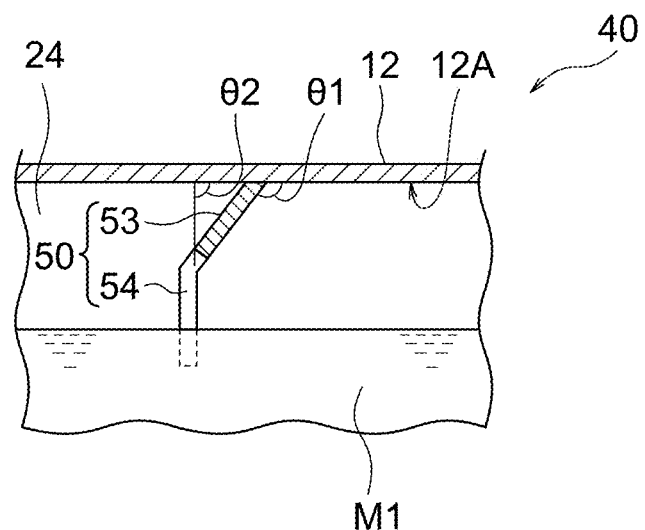
FIG. 8 is an enlarged partial view of FIG. 7.

FIG. 7 is a schematic cross-section illustrating a vapor-liquid reaction device according to a second exemplary embodiment. FIG. 8 is an enlarged partial view of FIG. 7.

FIG. 7 corresponds to FIG. 2 of the first exemplary embodiment, and FIG. 8 corresponds to FIG. 4 of the first exemplary embodiment.

A vapor-liquid reaction device 40 according to the second exemplary embodiment is an example in which the shape of the plural plate-shaped members has been changed from that in the vapor-liquid reaction device 10 according to the first exemplary embodiment.

As illustrated in FIG. 7, the vapor-liquid reaction device 40 includes plural plate-shaped members 51 and plural plate-shaped members 50 that serve as projecting members projecting into an internal space 24 from a ceiling face 12A adjoining the internal space 24 of a vapor-liquid reaction chamber 11. The plural plate-shaped members 51 and plural plate-shaped members 50 are each made from quartz.

The plural plate-shaped members 51 and the plural plate-shaped members 50 are arranged alternately along the length direction of the internal space, and are each welded to the ceiling face.

Leading ends of each of the plural plate-shaped members 51 and the plural plate-shaped members 50 are immersed in a molten metal M1 and are not in contact with a bottom plate 18. The plural plate-shaped members 51 and the plural plate-shaped members 50 each contact side plates 14 and 15.

In the vapor-liquid reaction device 40, a flow of gas is secured in the internal space 24 by slits respectively provided in the plural plate-shaped members 51 and the plural plate-shaped members 50.

The shape of the plate-shaped members 50 is a shape obtained by folding the plate-shaped member 20 at a projection direction central portion of the plate-shaped member 20 so as to be convex toward the downstream side. Thus, the plate-shaped members 50 each include a single slit, similarly to the plate-shaped members 20.

The shape of the plate-shaped members 51 is a shape obtained by folding the plate-shaped members 21 at a projection direction central portion of the plate-shaped members 21 so as to be convex toward the downstream side. Thus, the plate-shaped members 51 each include two slits, similarly to the plate-shaped members 21.

Due to the configuration described above, similarly to the vapor-liquid reaction device 10, in the vapor-liquid reaction device 40 the slits formed in each of the plate-shaped members of adjacent of the plate-shaped members are arranged at positions that do not overlap with each other when viewed from the length direction one end side of the internal space 24.

A more detailed explanation follows regarding the shape of the plate-shaped members 50, with reference to FIG. 8.

As illustrated in FIG. 8, the plate-shaped members 50 are configured from projecting portions 53 that project from the ceiling face 12A into the internal space 24, and bent portions 54 that are bent toward the upstream side with respect to the projection direction of the projecting portions 53.

The projection angle θ1 on the upstream side of the projecting portion 53 is an obtuse angle (i.e. exceeding 90° but is less than 180°). A preferable range of the projection angle θ1 is as previously stated.

An angle θ2 formed between a region of the ceiling face 12A on the upstream side and an upstream face of the bent portion 54, or between a virtual plane extending the ceiling face 12A toward the upstream side and the upstream face of the bent portion 54 is from 70° to 110°. A preferable range of the angle θ2 is as previously stated.

The plate-shaped members 50 exhibit similar advantageous effects to those of the first exemplary embodiment due to the projection angle θ1 of the projecting portions 53 being an obtuse angle.

Due to the plate-shaped members 50 further including the bent portions bent at the angle θ2, gas mixing in the vertical direction is further promoted, thereby better promoting the vapor-liquid reaction.

The shape of the plate-shaped members 51 is similar to the shape of the plate-shaped members 50, except for in the number and position of the slits.

The second exemplary embodiment has configuration similar to that of the first exemplary embodiment, with the exception of the shape of the plural plate-shaped members. Preferable modes and modified examples of the second exemplary embodiment are likewise similar to the preferable modes and modified examples of the first exemplary embodiment.

Third Exemplary Embodiment

Figure 9:
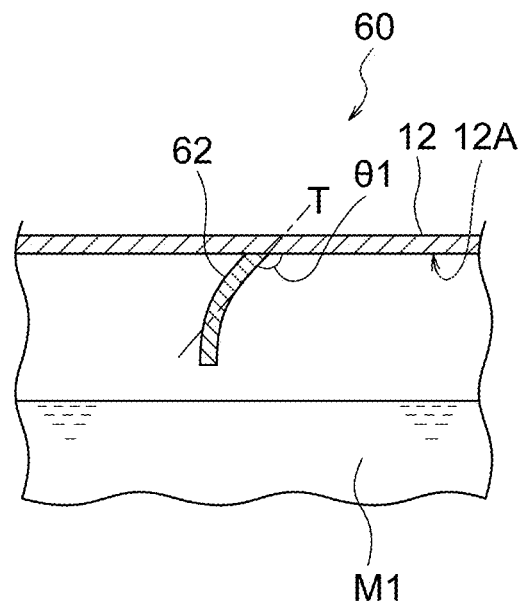
FIG. 9 is a part cross-section schematically illustrating part of a cross-section of a vapor-liquid reaction device according to a third exemplary embodiment.

FIG. 9 is a part cross-section schematically illustrating part of a cross-section of a vapor-liquid reaction device according to the third exemplary embodiment.

FIG. 9 corresponds to FIG. 4 of the first exemplary embodiment.

A vapor-liquid reaction device 60 according to the third exemplary embodiment is an example in which the plural plate-shaped members in the vapor-liquid reaction device 10 according to the first exemplary embodiment (the plural plate-shaped members 21 and the plural plate-shaped members 20) have been modified to plural plate-shaped members 62.

Although omitted from illustration, slits are formed in each of the plural plate-shaped members 62 to allow gas to pass through in the length direction of an internal space. The slits in an adjacent pair of the plate-shaped members 62 out of the plural plate-shaped members 62 are arranged at positions that do not overlap with each other when viewed from a length direction one end side of an internal space.

As illustrated in FIG. 9, the plate-shaped members 62 of the vapor-liquid reaction device 60 are configured solely from bent portions. Namely, the plate-shaped members 62 start to bend toward the upstream side at the same point as they start to project into the internal space 24, and the entirety of the plate-shaped members 62 is bent gradually toward the upstream side.

A projection angle θ1 of the plate-shaped member 62 of this shape is found, in the cross-section illustrated in FIG. 9, by drawing a tangent T to an upstream face of the plate-shaped member 62 at a point where the upstream face of the plate-shaped member 62 contacts the ceiling face 12A, and then measuring an angle formed between the tangent T and a virtual plane extending upstream from an upstream region of the ceiling face 12A or extending upstream from the ceiling face 12A.

Leading ends of the plate-shaped members 62 are arranged at positions separated from the liquid surface of the molten metal M1.

A modified example of the third exemplary embodiment is an example in which the leading ends of the plate-shaped members 62 are immersed in the molten metal M1, similarly to in the first and second exemplary embodiments.

The third exemplary embodiment has configuration similar to that of the first exemplary embodiment, with the exception of the shape of the plural plate-shaped members. Preferable modes and modified examples of the third exemplary embodiment are likewise similar to the preferable modes and modified examples of the first exemplary embodiment.

Fourth Exemplary Embodiment

Figure 10:
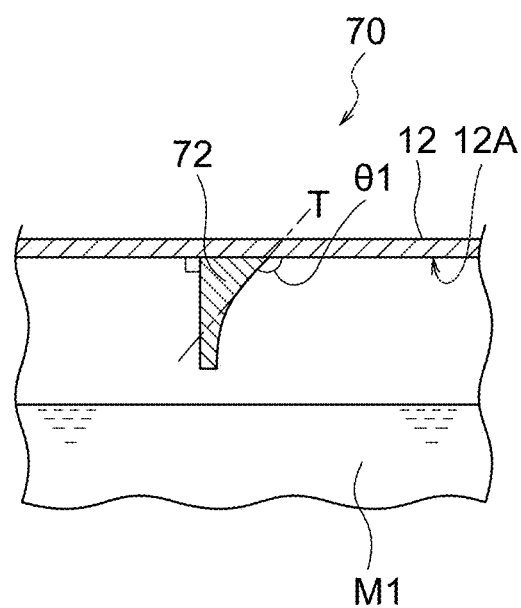
FIG. 10 is a part cross-section schematically illustrating part of a cross-section of a vapor-liquid reaction device according to a fourth exemplary embodiment.

FIG. 10 is a part cross-section schematically illustrating part of a cross-section of a vapor-liquid reaction device according to the fourth exemplary embodiment.

FIG. 10 corresponds to FIG. 4 of the first exemplary embodiment.

A vapor-liquid reaction device 70 according to the fourth exemplary embodiment is an example in which the plural plate-shaped members in the vapor-liquid reaction device 10 according to the first exemplary embodiment (the plural plate-shaped members 21 and the plural plate-shaped members 20) have been modified to plural projecting members 72 that are projecting members other than plate-shaped members.

Although omitted from illustration, slits are formed in each of the plural projecting members 72 to allow gas to pass through in the length direction of an internal space. The slits in an adjacent pair of the projecting members 72 out of the plural projecting members 72 are arranged at positions that do not overlap with each other when viewed from one end side of the internal space.

As illustrated in FIG. 10, upstream faces of the projecting members 72 in the vapor-liquid reaction device 70 are curved faces curved so as to be convex toward the downstream side. Downstream faces of the projecting members 72 are a flat faces perpendicular to the ceiling face 12A.

In the cross-section illustrated in FIG. 10, a projection angle θ1 at the upstream side of the thus shaped projecting member 72 is found by drawing a tangent T to the upstream face of the projecting member 72 at a point where the upstream face of the projecting member 72 contacts the ceiling face 12A, and then measuring an angle formed between the tangent T and a region of the ceiling face 12A on the upstream side or a virtual plane extending the ceiling face 12A toward the upstream side.

Leading ends of the projecting members 72 are arranged at positions separated from the liquid surface of the molten metal M1.

A modified example of the fourth exemplary embodiment is an example in which the leading ends of the projecting members 72 are immersed in the molten metal M1, similarly to in the first and second exemplary embodiments.

As demonstrated by the fourth exemplary embodiment, the projecting members of the present disclosure are not limited to being plate-shaped members. In essence, as long as an obtuse angle is set as the projection angle θ1 at the upstream side of the projecting member of the present disclosure, namely the angle formed between a region of a ceiling face on the upstream side and the upstream face of the projecting member, or between a virtual plane extending the ceiling face toward the upstream side and the upstream face of the projecting member, then the advantageous effects of the present disclosure (the advantageous effect of promoting gas mixing in the vertical direction, and the advantageous effect of suppressing gas from lingering at an upstream upper portion of the projecting member) are exhibited.

The projection angle on the downstream side of the projecting member is not particularly limited.

In addition to the cross-section profile of the projecting member 72 illustrated in FIG. 10, other examples of the cross-section profile of the projecting member include triangular shapes, trapezoidal shapes, peaked profiles that are not triangular shaped or trapezoidal shaped, and the like.

However, from the perspective of effective utilization of the internal space, the projecting member preferably includes a plate-shaped member, and plate-shaped members such as those exemplified in the first to the third exemplary embodiments are more preferable.

The first to fourth exemplary embodiments that have been described above may be employed in appropriate combinations.

For example, plural projecting members having different profiles and upstream projection angles θ1 to each other may be arrayed along the length direction of the internal space.

Comparative Embodiment of Vapor-Liquid Reaction Device

Explanation follows regarding a vapor-liquid reaction device according to a comparative embodiment that does not correspond to not a vapor-liquid reaction device of the present disclosure.

Figure 11:
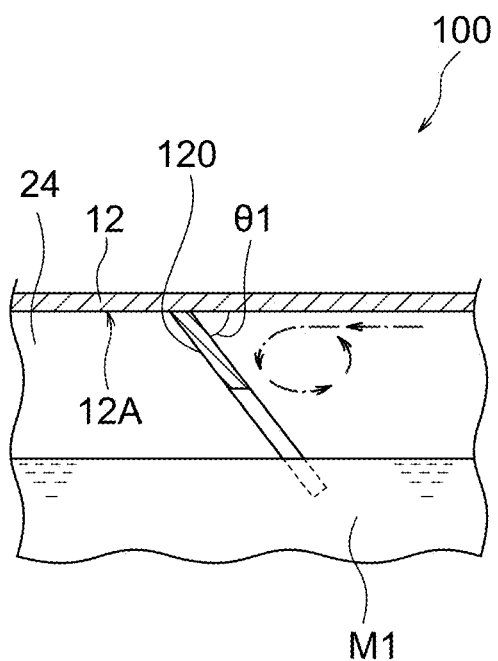
FIG. 11 is a part cross-section schematically illustrating part of a cross-section of a vapor-liquid reaction device according to a comparative embodiment.

FIG. 11 is a part cross-section schematically illustrating part of a cross-section of a vapor-liquid reaction device 100 according to a comparative embodiment.

FIG. 11 corresponds to FIG. 4 of the first exemplary embodiment.

As illustrated in FIG. 11, the vapor-liquid reaction device 100 according to the comparative embodiment is an example in which the plural plate-shaped members of the vapor-liquid reaction device 10 according to the first exemplary embodiment have been modified to plate-shaped members 120 having an upstream projection angle θ1 that is an acute angle (i.e. 0° or greater but less than 90°).

The flow of gas that has reached the plate-shaped member 120 changes abruptly to follow the plate-shaped member 120 that projects into the internal space at an acute angle. Thus, excessive eddying occurs at an upper portion region upstream of the plate-shaped member 120 (see the single-dotted broken line arrow in FIG. 11).

In the vapor-liquid reaction device 100 according to the comparative example gas may therefore linger in an upper portion region upstream of the plate-shaped member 120 due to excessive eddying. Thus in the vapor-liquid reaction device 100 according to the comparative example, the issue of a layered flow impeding the vapor-liquid reaction may not be resolved even when the projecting member is employed therein.

In another comparative embodiment, a similar issue to the issue in this comparative embodiment might arise even were the upstream projection angle θ1 of the plate-shaped member 120 to be changed to 90°.

As explained above, the vapor-liquid reaction device of the present disclosure exhibits the advantageous effect of promoting the reaction between the molten metal and the source gas when the carrier gas employed is nitrogen gas and/or argon gas. Namely, the vapor-liquid reaction device of the present disclosure is a device in which nitrogen gas and/or argon gas is employed as the carrier gas.

However, the vapor-liquid reaction device of the present disclosure may also be used when nitrogen gas and/or argon gas are substituted for a gas other than nitrogen gas or argon gas (for example, hydrogen gas, helium gas, or the like) as the carrier gas. The reaction between the molten metal and the source gas can also be performed in such cases.

Reaction Tube, Film Forming Apparatus

A reaction tube of the present disclosure includes the vapor-liquid reaction device of the present disclosure.

A film forming apparatus of the present disclosure include the reaction tube of the present disclosure.

The definition of "film forming" here encompasses both forming a self-supported film (not employing a support substrate) and forming a film on a support substrate.

Examples of support substrates include single crystal substrates such as an (0001) sapphire substrate, a silicon carbide substrate, a gallium nitride substrate, and the like.

An example of reaction tube of the present disclosure is a reaction tube including an embodiment of a vapor-liquid reaction device in which the molten metal is gallium (molten Ga), the source gas is a first chlorine gas feed ($Cl_2$), and the produced gas is gallium (I) chloride gas (GaCl).

In the reaction tube according to this example, gallium (III) chloride gas ($GaCl_3$) is produced by a reaction between gallium (I) chloride gas (GaCl) discharged into the reaction tube from the vapor-liquid reaction device of the above embodiment and a second chlorine gas feed ($Cl_2$) that is supplied from outside the vapor-liquid reaction device inside the reaction tube.

In the vapor-liquid reaction device of the above embodiment, the reaction between the molten metal (molten Ga) and the source gas ($Cl_2$) is promoted even though the carrier gas employed is at least one out of nitrogen gas and argon gas, and so the gallium (I) chloride gas (GaCl) produced is suppressed from having source gas ($Cl_2$) mixed therein. Thus in the reaction tube according to the example described above, the gallium (III) chloride gas ($GaCl_3$) obtained is suppressed from having the source gas ($Cl_2$) mixed therein by reacting the gallium (I) chloride gas (GaCl) suppressed from having the source gas ($Cl_2$) mixed therein together with the second chlorine gas feed ($Cl_2$).

An example of the film forming apparatus of the present disclosure is a film forming apparatus including the reaction tube according to the above example.

In the film forming apparatus according to this example, a gallium nitride film is formed by a reaction between the gallium (III) chloride gas produced in the reaction tube according to the above example and ammonia gas supplied inside the film forming apparatus but outside the reaction tube.

Namely, the film forming apparatus according to this example is a film forming apparatus for forming a gallium nitride (GaN) film using THVPE.

The film forming apparatus according to this example is able to employ gallium (III) chloride gas (GaCl$_3$) suppressed from having the source gas (Cl$_2$) mixed therein to grow a gallium nitride film at a high growth rate.

As described above, were gallium (III) chloride gas (GaCl$_3$) having the source gas (Cl$_2$) mixed therein to be employed to grow a gallium nitride film, there would be a concern that the growth rate of the gallium nitride film might drop due to the mixed in Cl$_2$ gas etching the gallium nitride film.

However, the reaction tube of the present disclosure is not limited to the example described above. In essence, as long as the reaction tube of the present disclosure includes the vapor-liquid reaction device of the present disclosure then there are no particular other limitations thereto.

Moreover, the film forming apparatus of the present disclosure is not limited to the example described above. In essence, as long as the film forming apparatus of the present disclosure includes the reaction tube of the present disclosure then there are no particular other limitations thereto.

Exemplary Embodiment of Film Forming Apparatus

Explanation follows regarding an exemplary embodiment of a film forming apparatus of the present disclosure.

Figure 12:
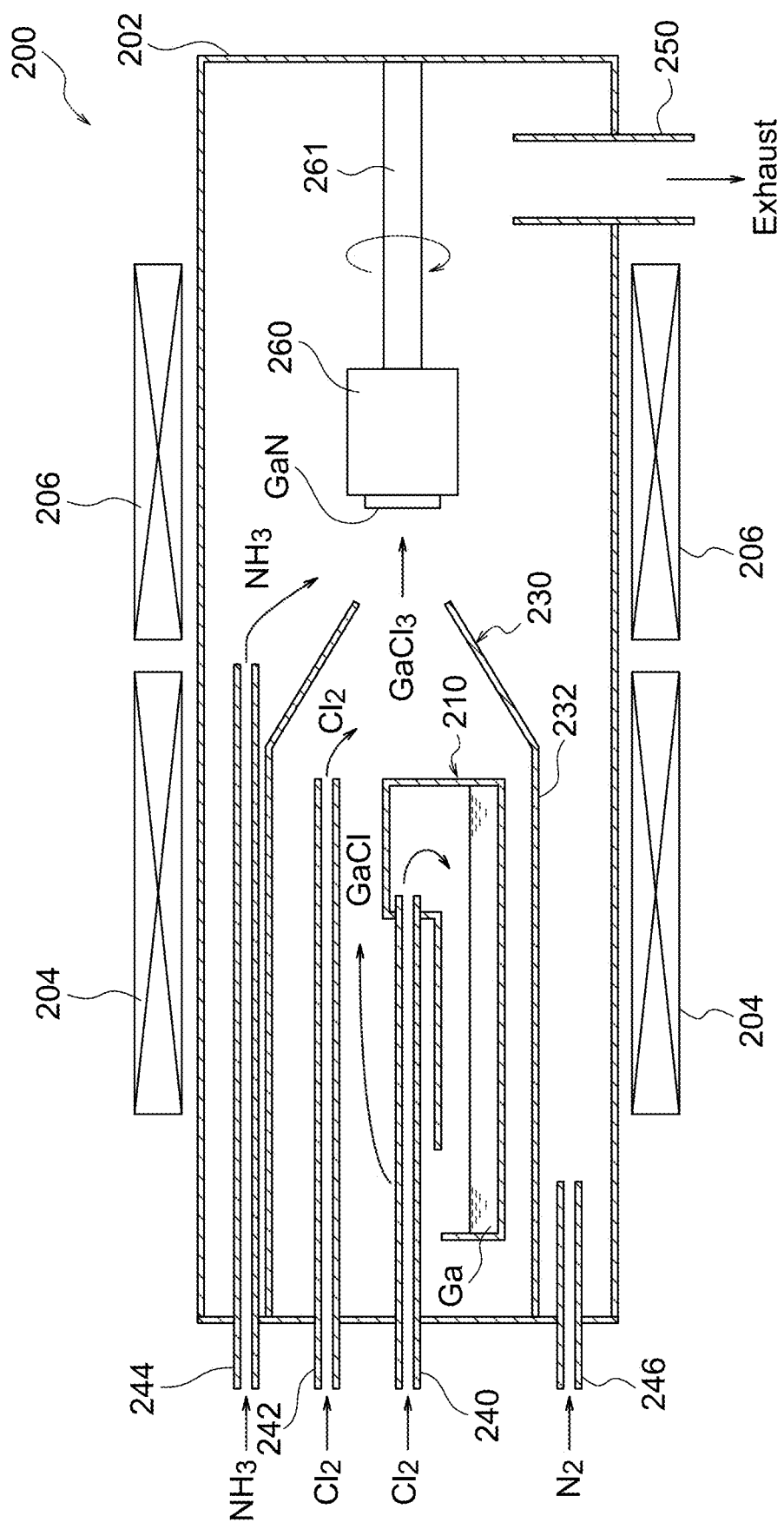
FIG. 12 is a schematic cross-section schematically illustrating a film forming apparatus according to an exemplary embodiment.

FIG. 12 is a schematic cross-section that schematically illustrates a film forming apparatus 200 according to an exemplary embodiment of the film forming apparatus of the present disclosure.

The film forming apparatus 200 is a film forming apparatus to form a gallium nitride (GaN) film using THVPE.

As illustrated in FIG. 12, the film forming apparatus 200 includes a tube shaped casing 202, and a reaction tube 230 and a susceptor 260 arranged inside the casing 202.

The reaction tube 230 is a member to produce GaCl$_3$ that is a source gas for a gallium nitride (GaN) film. The susceptor 260 is a member for supporting the gallium nitride (GaN) film.

Examples of the materials of the casing 202 and the reaction tube 230 include quartz, sapphire, silicon carbide (SiC), or the like.

Examples of the material of the susceptor 260 include ceramics (for example a composite sintered body of silicon nitride and boron nitride).

The reaction tube 230 includes a tube body 232, and a vapor-liquid reaction device 210 arranged inside the tube body 232.

The vapor-liquid reaction device 210 arranged inside the tube body 232 is an example of a vapor-liquid reaction device of the present disclosure. However, illustration of the projecting members is omitted in FIG. 12.

A supply pipe 240 is connected to an upper portion at one end side of the vapor-liquid reaction device 210 in order to supply a mixed gas A (not illustrated in the drawings) configured by a mixture of N$_2$ serving as the carrier gas (not illustrated in the drawings) and a first chlorine gas feed (Cl$_2$) serving as the source gas.

GaCl is produced inside the vapor-liquid reaction device 210 as the produced gas through a vapor-liquid reaction between the Cl$_2$ in the mixed gas A supplied through the supply pipe 240 and Ga serving as the molten metal held inside the vapor-liquid reaction device 210.

The GaCl serving as the produced gas is discharged, together with N$_2$ serving as the carrier gas (not illustrated in the drawings), through a discharge port at an upper portion at the other end side of the vapor-liquid reaction device 210, and also serves as the mixed gas B (not illustrated in the drawings).

Argon (Ar) may also be employed as the carrier gas in addition to N$_2$, or instead of N$_2$.

One opening in the tube body 232 is closed off by a length direction one end side of an inner wall of the casing 202, and another opening in the tube body 232 opens toward the susceptor 260.

A supply pipe 242 is provided in the film forming apparatus 200 for supplying a second chlorine gas feed (Cl$_2$) inside the tube body 232 but outside the vapor-liquid reaction device 210. An opening of the supply pipe 242 is arranged inside the tube body 232 so as to be downstream (at the susceptor 260 side) of the discharge port of the vapor-liquid reaction device 210.

GaCl$_3$ is produced inside the tube body 232 through a reaction between the Cl$_2$ supplied through the supply pipe 242 and the GaCl discharged from the vapor-liquid reaction device 210.

The produced GaCl$_3$ is discharged through the other opening in the tube body 232 toward the susceptor 260.

The inner diameter of the tube body 232 gradually decreases on progression from a location of the tube body 232 in the vicinity of the other opening (on the susceptor 260 side) toward the other opening. This accordingly enables GaCl$_3$ to be emitted with good efficiency toward the susceptor 260.

A supply pipe 244 is provided in the film forming apparatus 200 to supply NH$_3$ inside the casing 202 but outside the reaction tube 230.

A gallium nitride (GaN) film is grown through a reaction inside the casing 202 between then NH$_3$ supplied through the supply pipe 244 and the GaCl$_3$ discharged from the reaction tube 230.

The susceptor 260 is rotatably supported through a rotation shaft 261 at the length direction other end side of the inner wall of the casing 202.

A non-illustrated substrate is mounted to the susceptor 260, and the gallium nitride (GaN) film is grown on the substrate.

A supply pipe 246 is provided in the film forming apparatus 200 to supply N$_2$ serving as the carrier gas inside the casing 202 but outside the reaction tube 230. The gallium nitride (GaN) film is grown as the carrier gas N$_2$ supplied through the supply pipe 246 flows.

An exhaust pipe 250 is provided to a lower portion at the length direction other end side (the side where the susceptor 260 is supported) of the casing 202 to exhaust the casing 202 interior.

Excess gas inside the casing 202 is exhausted by exhausting the casing 202 interior through the exhaust pipe 250, thus enabling a gas flow to be formed to draw the respective gases, including the GaCl, GaCl$_3$, and NH$_3$ etc., toward the susceptor 260.

A heater 204 and a heater 206 are arranged at the periphery of the casing 202. The heater 204 heats up the vapor-liquid reaction device 210 and the vicinity thereof (hereafter referred to as the "source section"), and the heater 206 heats up the susceptor 260 and the vicinity thereof (also referred to as the "growth section").

The growing of the gallium nitride (GaN) film is performed while independently heating the source section and the growth section to the desired temperatures using the heater 204 and the heater 206, respectively.

The heating temperature of the source section is, for example, from 500° C. to 1500° C., is preferably from 600° C. to 1200° C., and is more preferably from 700° C. to 1000° C.

The heating temperature of the growth section is, for example, from 900° C. to 1500° C., is preferably from 1000° C. to 1500° C., and is more preferably from 1100° C. to 1400° C.

Regarding configurations of the film forming apparatus 200, reference may be made to published documents such as WO No. 2011/142402, JP-A No. 2016-44342, and JP-A No. 2012-248803 as appropriate.

The vapor-liquid reaction device 210 provided to the film forming apparatus 200 is a vapor-liquid reaction device capable of promoting a reaction between a molten metal and a source gas even when at least one gas out of nitrogen gas or argon gas is employed as the carrier gas, as described above.

Thus in the film forming apparatus 200 a phenomenon in which source gas (the first chlorine gas feed) unreacted in a source section is carried over into the growth section, and a drop in the growth rate of the gallium nitride film (i.e. etching of the gallium nitride film by the first chlorine gas feed) caused by this phenomenon, are both suppressed from occurring.

The film forming apparatus 200 thus enables a gallium nitride film to be grown at a high growth rate.

The side of the film forming apparatus 200 where the source gas (first chlorine gas feed) of the vapor-liquid reaction device 210 is supplied is arranged on the downstream side in the flow of gas through the overall film forming apparatus 200, and the side where the produced gas (GaCl) of the vapor-liquid reaction device 210 is discharged is arranged on the upstream side in the flow of gas through the overall film forming apparatus 200. The direction of the flow of gas inside the vapor-liquid reaction device 210 is thereby the opposite direction to the direction of flow of gas through the overall film forming apparatus 200. The GaCl can thereby be caused to dwell longer in a region where the $GaCl_3$ is produced by the reaction between the GaCl and the second chlorine gas feed. This enables the reaction in which the $GaCl_3$ is produced by the reaction between the GaCl and the second chlorine gas feed to also be performed with good efficiency.

Thus in the film forming apparatus 200, the phenomenon in which unreacted chlorine gas from the second chlorine gas feed is carried over into the growth section is suppressed, suppressing etching of the gallium nitride film due to the second chlorine gas feed.

The film forming apparatus 200 accordingly enables a gallium nitride film to be grown at a higher growth rate.

EXAMPLES

Examples of the present disclosure are illustrated below. However, the present disclosure is not limited to the following examples.

Test Example 1

Evaluation was performed by simulating the mass concentrations of the source gas and the produced gas in cases in which the first exemplary embodiment (the vapor-liquid reaction device 10) was applied with projecting members 1 to 5 having different projection angles $\theta 1$ at the upstream side of the projecting member (Test Example 1).

The simulations were performed using SCRYU/Tetra (registered trademark) produced by Software Cradle Co., Ltd. under the following evaluation conditions.

The projecting members 1 to 5 are projecting members with the shapes and upstream projection angles $\theta 1$ listed in Table 1.

The projecting members 1 and 2 are Comparative Examples, and the projecting members 3 to 5 are Examples.

The projecting members 3 and 4 correspond to the plate-shaped members 20 and 21 of the first exemplary embodiment, and the projecting member 5 corresponds to the plate-shaped members 50 and 51 of the second exemplary embodiment.

Evaluation Conditions

Nitrogen gas was employed as the carrier gas, $Cl_2$ was employed as the source gas, gallium (molten Ga) was employed as the molten metal, and the produced gas was GaCl.

The length direction length of the internal space 24 was 292 mm, the width direction length (the length in a direction orthogonal to the vertical direction and the length direction) of the internal space 24 was 69 mm, the height from the liquid surface of the molten Ga to the ceiling face 12A was 7 mm, the height from the liquid surface of the molten Ga to the ceiling face of the top plate 13 was 25 mm, the depth of the molten Ga was 31.5 mm, and the length (length in the length direction of the internal space 24) of the top plate 13 was 66 mm.

The distance between adjacent plate-shaped members (the distance between portions thereof connected to the ceiling face) was 16 mm. The number of plate-shaped members was 10.

More specifically, regarding the 10 plate-shaped members, plate-shaped members with a single slit similar to the plate-shaped members 20, and plate-shaped members with two slits similar to the plate-shaped members 21, were alternately arrayed along the length direction of the internal space 24.

The width direction length of each slit in the respective plate-shaped members (i.e. a length in the width direction of the internal space 24) was 9 mm (i.e. 13% of the width direction length of the internal space 24).

The height from the liquid surface of the molten Ga to the upper end of each slit of the respective plate-shaped members was 1.5 mm, and the temperature of the molten Ga was 850° C.

The supply flow rate of the mixed gas A of the mixture of carrier gas and source gas was 1 SLM, the temperature of the mixed gas A was 750° C., and the supply flow rate of the source gas was 50 SCCM.

The evaluation position was evaluation point P in FIG. 2 and FIG. 3 (i.e. an evaluation point between the second plate-shaped member and the third plate-shaped member from the upstream side at a position not affected by gas inflow through a slit).

Under the conditions listed above, the mass concentrations of source gas ($Cl_2$) and produced gas (GaCl) were found at the evaluation point P in FIG. 2 and FIG. 3 after 300 seconds had elapsed since starting supply of the mixed gas A.

The mass concentrations of the source gas ($Cl_2$) and produced gas (GaCl) are expressed by values relative to 100, this being the maximum value at the projecting members 1 to 5.

The evaluation results are given in table 1.

In this evaluation, the lower the value of the mass concentration of the source gas ($Cl_2$) the better the advantageous effect of vapor-liquid reaction promotion, and the higher the mass concentration of the produced gas (GaCl) the better the advantageous effect exhibited of vapor-liquid reaction promotion.

TABLE 1

|  | Projecting Member 1 | Projecting Member 2 | Projecting Member 3 | Projecting Member 4 | Projecting Member 5 |
|---|---|---|---|---|---|
| Shape of projecting member | Plate-shaped (no bent portion) | Plate-shaped (no bent portion) | Plate-shaped (no bent portion) | Plate-shaped (no bent portion) | Plate-shaped (including bent portion) |
| Projection angle θ1 | 90° | 45° | 135° | 150° | 135° |
| Angle θ2 | — | — | — | — | 90° |
| Mass concentration of source gas ($Cl_2$) (relative value) | 100 | 100 | 69 | 75 | 63 |
| Mass concentration of produced gas (GaCl) | 77 | 71 | 97 | 94 | 100 |
| Remarks | Comparative Example | Comparative Example | Example | Example | Example |

As illustrated by Table 1, for the projecting members 3 to 5 having an obtuse angle as the upstream projection angle θ1, the mass concentration of the source gas ($Cl_2$) was lower and the mass concentration of the produced gas (GaCl) was higher than for the projecting members 1 and 2 for which the upstream projection angle θ1 was 90° or an acute angle.

This accordingly confirmed that the projecting members 3 to 5 promote the vapor-liquid reaction in comparison to the projecting members 1 and 2.

The projecting members 3 to 5 each include slits to allow gas to pass through, and thus exhibited an excellent advantageous effect of suppressing gas from lingering inside the device (inside the vapor-liquid reaction chamber) compared to projecting members lacking slits.

Test Example 2

A vapor-liquid reaction device applying the projecting member 5 of Test Example 1 was actually manufactured. This vapor-liquid reaction device is referred to hereafter as the vapor-liquid reaction device A. A film forming apparatus 200 was prepared according to the exemplary embodiment described above, and the vapor-liquid reaction device A was set in the film forming apparatus 200 as the vapor-liquid reaction device 210. The film forming apparatus of Example 101 below is a film forming apparatus set with the vapor-liquid reaction device A.

A vapor-liquid reaction device X having a configuration similar to that of the vapor-liquid reaction device A except in that the 10 projecting members 5 had been removed therefrom (i.e. a comparative vapor-liquid reaction device lacking projecting members) was also actually manufactured. Next, the vapor-liquid reaction device A in the film forming apparatus of Example 101 was replaced with the vapor-liquid reaction device X to produce a film forming apparatus of a Comparative Example 101.

The relationship between the total flow rate of gas in the vapor-liquid reaction device and the growth rate of the GaN film was evaluated in the respective the film forming apparatuses of Example 101 and Comparative Example 101. The results are illustrated in FIG. 13.

The conditions in the growth section were as follows.

Growth section: growing temperature 1250° C.; ammonia partial pressure 0.2 atm; $GaCl_3$ partial pressure 0.005 atm.

Figure 13:
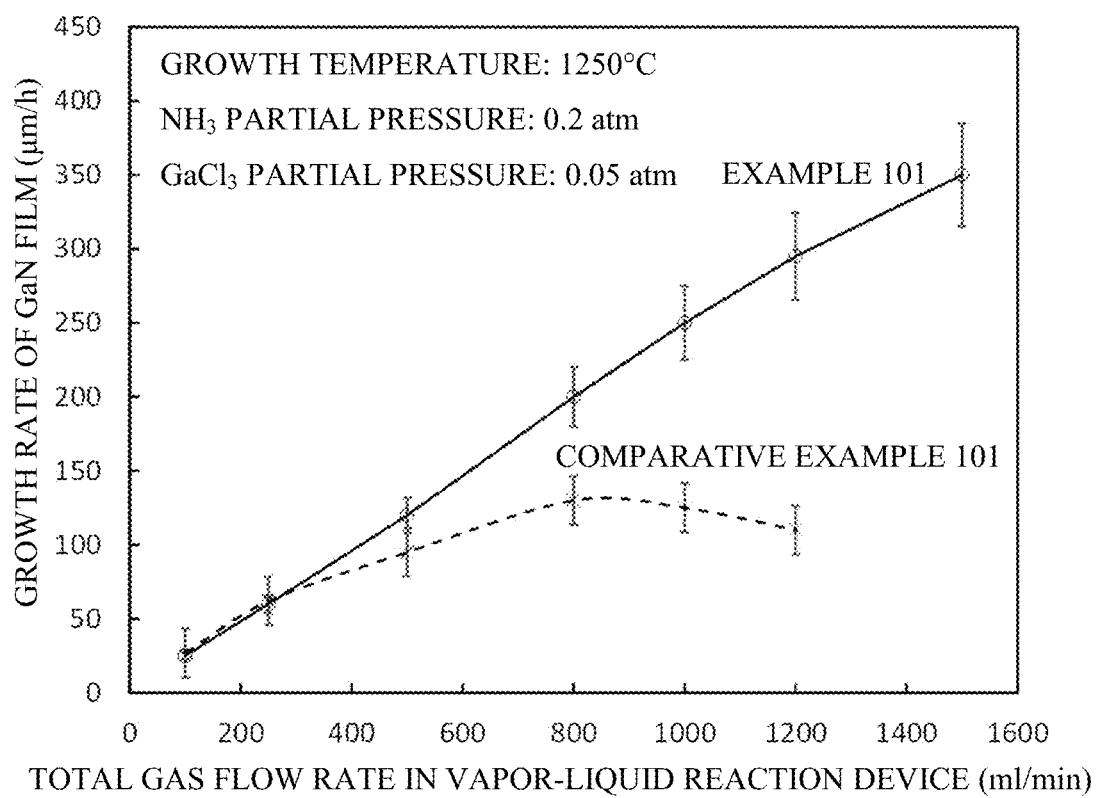
FIG. 13 is a graph illustrating a relationship between the total flow rate of gas in a vapor-liquid reaction device and the growth rate of a GaN film in a Test Example 2.

FIG. 13 is a graph illustrating the relationship between the total flow rate of gas in the vapor-liquid reaction device and the growth rate of the GaN film.

As illustrated in FIG. 13, in the film forming apparatus of Example 101 the growth rate of the GaN film was substantially proportional to the total flow rate of gas in the vapor-liquid reaction device (see the solid line).

These results imply that when employing the film forming apparatus of Example 101, the reaction of the Reaction Equation (2) given below in which a 100% reaction in the vapor-liquid reaction device would be thermodynamically expected had indeed progressed to substantially 100%.

$$Ga(l) + \tfrac{1}{2}Cl_2(g) \rightarrow GaCl(g) \qquad \text{Reaction Equation(2)}.$$

As illustrated in FIG. 13, in the film forming apparatus of the Comparative Example 101, the rate of increase in the growth rate of the GaN film dropped as the total flow rate of gas in the vapor-liquid reaction device increased. Furthermore, in a region of total gas flow rate of 800 ml/min and above the growth rate of the GaN film actually dropped as the total gas flow rate increased.

These results are thought to imply that when the film forming apparatus of the Comparative Example 101 was employed, the reaction of Reaction Equation (2) did not progress to completion in the vapor-liquid reaction device, resulting in unreacted $Cl_2$ being carried over into the growth section.

Namely, it is thought that the GaN film was etched by $Cl_2$ as a result of unreacted $Cl_2$ being mixed in with the $GaCl_3$ providing the raw material for the GaN film, resulting in a drop in the growth rate of the GaN film.

In particular in the region of total gas flow rate of 800 ml/min and above, it is thought that as the total gas flow rate increased the unreacted $Cl_2$ also increased, such that as the total gas flow rate increased the growth rate of the GaN film dropped as a result.

The entire content of the disclosure of Japanese Patent Application No. 2017-098870 filed on May 18, 2017 is incorporated by reference in the present specification.

All publications, patent applications and technical standards mentioned in the present specification are incorporated by reference in the present specification to the same extent as if each individual publication, patent application, or technical standard was specifically and individually indicated to be incorporated by reference.

The invention claimed is:

1. A vapor-liquid reaction device comprising:
a vapor-liquid reaction chamber including:
an internal space for accommodating a molten metal in a lower portion of the internal space of the vapor-liquid reaction chamber, and a produced gas being produced in the vapor-liquid reaction chamber by a vapor-liquid reaction between a source gas and the molten metal,
a supply port for supplying a mixed gas A including the source gas and a carrier gas, to an upper portion of the internal space at one end side in a length direction of the internal space, wherein the carrier gas is at least one of nitrogen gas or argon gas, and the mixed gas A flows along the length direction of the internal space, and
a discharge port for discharging a mixed gas B containing the produced gas and the carrier gas from the upper portion of the internal space at another end side in the length direction of the internal space,
wherein the supply port supplies the mixed gas A to the upper portion such that the mixed gas A enters the upper portion in a supply direction from the other end side toward the one end side of the internal space and then changes direction from the supply direction to a flow direction flowing through the internal space from the one end side to the other end side of the internal space; and
a projecting member projecting into the internal space from a ceiling face adjoining the internal space of the vapor-liquid reaction chamber at a projection angle that is an obtuse angle formed between a surface of the ceiling face toward the one end side and a surface of the projection member facing toward the one end side in the length direction of the internal space, the projecting member including a slit formed within the projecting member for allowing passage of gas along the length direction of the internal space.

2. The vapor-liquid reaction device of claim 1, wherein the projection angle is from 110° to 160°.

3. The vapor-liquid reaction device of claim 1, wherein the projecting member includes a plate-shaped member projecting from the ceiling face into the internal space.

4. The vapor-liquid reaction device of claim 3, wherein the plate-shaped member includes a bent portion bent toward the one end side with respect to a projection direction of the plate-shaped member from the ceiling face into the internal space.

5. The vapor-liquid reaction device of claim 4, wherein:
the plate-shaped member includes a projecting portion that projects from the ceiling face into the internal space, and includes the bent portion; and
an angle formed between a region of the ceiling face toward the one end side and a face of the bent portion facing toward the one end side is from 70° to 110°.

6. The vapor-liquid reaction device of claim 1, wherein a length of the slit in a width direction of the internal space is from 2% to 50% of the width direction length of the internal space.

7. The vapor-liquid reaction device of claim 1, wherein the slit is a notch formed by notching from a leading end side of the projecting member toward a base side of the projecting member.

8. The vapor-liquid reaction device of claim 7, wherein a length direction of the slit is a direction from the leading end side of the projecting member toward the base side of the projecting member.

9. The vapor-liquid reaction device of claim 1, wherein:
the projecting member includes a plurality of projecting members arrayed along the length direction of the internal space, and
the slits in an adjacent pair of projecting members among the plurality of the projecting members are arranged at positions that do not overlap with each other as viewed in the length direction of the internal space from the one end side of the internal space.

10. The vapor-liquid reaction device of claim 1, wherein:
the molten metal is gallium;
the source gas is at least one out of chlorine gas or hydrogen chloride gas; and
the produced gas is gallium (I) chloride gas.

11. The vapor-liquid reaction device of claim 1, wherein a leading end of the projecting member is immersed in the molten metal in the lower portion of the internal space.

12. The vapor-liquid reaction device of claim 1, wherein the leading end of the projecting member does not contact a bottom plate of the vapor-liquid reaction chamber, the bottom plate opposing the ceiling face.

13. A reaction tube comprising the vapor-liquid reaction device of claim 1 provided inside the reaction tube.

14. The reaction tube of claim 13, wherein:
the molten metal is gallium;
the source gas is a first chlorine gas feed;
the produced gas is gallium (I) chloride gas; and
gallium (III) chloride gas is produced by a reaction between the gallium (I) chloride gas and a second chlorine gas feed.

15. A film forming apparatus comprising the reaction tube of claim 14, the film forming apparatus being configured to form a gallium nitride film by a reaction between gallium (III) chloride gas produced in the reaction tube and ammonia gas.

16. A film forming apparatus comprising the reaction tube of claim 13.

17. A vapor-liquid reaction device comprising:
a vapor-liquid reaction chamber including an internal space for accommodating a molten metal in a lower portion of the internal space, and a produced gas being produced in the vapor-liquid reaction chamber by a vapor-liquid reaction between a source gas and the molten metal,
wherein the source gas is supplied to an upper portion of the internal space at a first side in a length direction of the internal space, and the source gas flows along the length direction of the internal space, and the produced gas is discharged from the upper portion of the internal space at a second side in the length direction of the internal space,
wherein the source gas is supplied to the upper portion such that the source gas enters the upper portion in a supply direction from the second side toward the first side of the internal space and then changes direction from the supply direction to a flow direction flowing through the internal space from the first side to the second side of the internal space; and a projecting member projecting into the internal space from a ceiling face adjoining the internal space of the vapor-liquid reaction chamber at a projection angle that is an obtuse angle between a region of the ceiling face toward the first side and a face of the projection member facing toward the first side, the projecting member including a slit formed from an end of the projecting member to within the projecting member for allowing passage of gas along the length direction of the internal space.

18. The vapor-liquid reaction device of claim 17, wherein the projection angle is from 110° to 160°.

19. The vapor-liquid reaction device of claim 17, wherein:
the projecting member includes a plurality of projecting members arrayed along the length direction of the internal space, and
the slits in an adjacent pair of projecting members among the plurality of the projecting members are arranged at positions that do not overlap with each other as viewed in the length direction of the internal space from the first side of the internal space.

20. The vapor-liquid reaction device of claim 17, wherein a leading end of the projecting member is immersed in the molten metal in the lower portion of the internal space.

* * * * *